1608B1

(12) United States Patent
Chao

(10) Patent No.: US 10,541,608 B1
(45) Date of Patent: Jan. 21, 2020

(54) DIFFERENTIAL CONTROLLER WITH REGULATORS

(71) Applicant: Linear Technology Holding, LLC, Norwood, MA (US)

(72) Inventor: Hio Leong Chao, Tempe, AZ (US)

(73) Assignee: Linear Technology Holding, LLC, Norwood, MA (US)

(*) Notice: Subject to any disclaimer, the term of this patent is extended or adjusted under 35 U.S.C. 154(b) by 0 days.

(21) Appl. No.: 16/024,357

(22) Filed: Jun. 29, 2018

(51) Int. Cl.
| | |
|---|---|
| *H02M 3/155* | (2006.01) |
| *G05F 1/46* | (2006.01) |
| *H03F 1/32* | (2006.01) |
| *G05B 11/28* | (2006.01) |

(52) U.S. Cl.
CPC ............ *H02M 3/155* (2013.01); *G05F 1/461* (2013.01); *H03F 1/3211* (2013.01); *G05B 11/28* (2013.01); *H03F 2200/351* (2013.01)

(58) Field of Classification Search
CPC . H02M 3/155–1588; H02M 2001/007; H02M 2001/0045; H02M 2001/0067; H02M 2001/0083
See application file for complete search history.

(56) References Cited

U.S. PATENT DOCUMENTS

| | | | |
|---|---|---|---|
| 6,462,520 B1 | 10/2002 | Mangtani et al. | |
| 6,768,658 B2 | 7/2004 | Perry | |
| 8,160,520 B2* | 4/2012 | Srinivasan | ............ H03F 1/0216 455/127.3 |
| 8,710,810 B1 | 4/2014 | McJimsey et al. | |
| 10,136,488 B1* | 11/2018 | Kwon | ................ H05B 33/0845 |
| 2003/0137286 A1* | 7/2003 | Kimball | ............. H02M 3/1584 323/271 |
| 2005/0068121 A1 | 3/2005 | Nielsen et al. | |
| 2006/0192536 A1* | 8/2006 | Chen | ..................... H02M 3/157 323/222 |

(Continued)

FOREIGN PATENT DOCUMENTS

| | | |
|---|---|---|
| DE | 102012217118 A1 | 3/2014 |
| EP | 3142251 A2 | 3/2017 |

OTHER PUBLICATIONS

"ANP 18: Selecting Appropriate Compensation: Type-II or Type III", Sipex Corporation Application Note, (May 2006), 3 pgs.

(Continued)

*Primary Examiner* — Yusef A Ahmed
(74) *Attorney, Agent, or Firm* — Schwegman Lundberg & Woessner, P.A.

(57) ABSTRACT

Various examples described herein are directed to a differential controller including a first regulator and a second regulator. The first regulator receives a first regulator control signal and generates a first regulator output signal. The second regulator receives a second regulator control signal and generates a second regulator output signal. A load is electrically coupled between a first regulator output and a second regulator output. The load current and voltage are based on a difference between the first regulator output and the second regulator output. A current sensor generates a load current signal that describes a load current at the load. A first amplifier generates the first regulator control using the load current signal and a control signal. A second amplifier generates the second regulator control signal using the first regulator input voltage and a common mode voltage.

25 Claims, 16 Drawing Sheets

(56) References Cited

U.S. PATENT DOCUMENTS

| | | | | |
|---|---|---|---|---|
| 2007/0296387 | A1* | 12/2007 | Dong | H02M 3/157 323/285 |
| 2009/0200998 | A1* | 8/2009 | Feng | H02M 3/156 323/234 |
| 2010/0320983 | A1* | 12/2010 | Wu | H02M 3/156 323/283 |
| 2012/0212293 | A1* | 8/2012 | Khlat | H03F 1/0227 330/127 |
| 2012/0313597 | A1* | 12/2012 | Hunter | G05F 1/575 323/280 |
| 2013/0002213 | A1* | 1/2013 | Khare | G05F 1/563 323/266 |
| 2013/0162233 | A1* | 6/2013 | Marty | H02M 3/158 323/274 |
| 2013/0193755 | A1* | 8/2013 | Chang | H02J 1/10 307/18 |
| 2014/0139199 | A1* | 5/2014 | Khlat | H02M 3/1582 323/282 |
| 2014/0253082 | A1* | 9/2014 | Swanson | H02M 3/156 323/284 |
| 2014/0375288 | A1* | 12/2014 | Nora | H02M 3/1584 323/272 |
| 2015/0028832 | A1* | 1/2015 | Tournatory | H02M 3/1584 323/271 |
| 2016/0062375 | A1* | 3/2016 | Houston | G05F 1/56 323/280 |
| 2016/0181988 | A1* | 6/2016 | Du | H03G 3/348 330/296 |

OTHER PUBLICATIONS

Erickson, Robert W., "Fundamentals of Power Electronics, Chapter 9: Controller Design", Kluwer Academic, (version 10 28 1998), 43 pgs.

Erickson, Robert W., "DC-DC Power Converters", Wiley Encyclopedia of Electrical and Electronics Engineering, (Jun. 2007), 19 pgs.

Meeks, Daniel, "Loop Stability Analysis of Voltage Mode Buck Regulator With Different Output Capacitor Types, Continuous and Discontinuous Modes", Texas Instruments Application Report SLVA301, (Apr. 2008), 36 pgs.

Zhang, Zach, "Buck Converter Control Cookbook", Alpha Omega Semiconductor Application Note PIC-003, URL: http: www.aosmd. com res application_notes power-ics PIC-003.pdf, (Aug. 2008), 11 pgs.

"European Application Serial No. 19182865.6, Extended European Search Report dated Oct. 16, 2019", 9 pgs.

Yao, Zhilei, et al., "Dual-Buck Full-Bridge Inverter With Hysteresis Current Control", IEEE Transactions on Industrial Electronics, 56(8), (Aug. 2, 2009), 3153-3160.

* cited by examiner

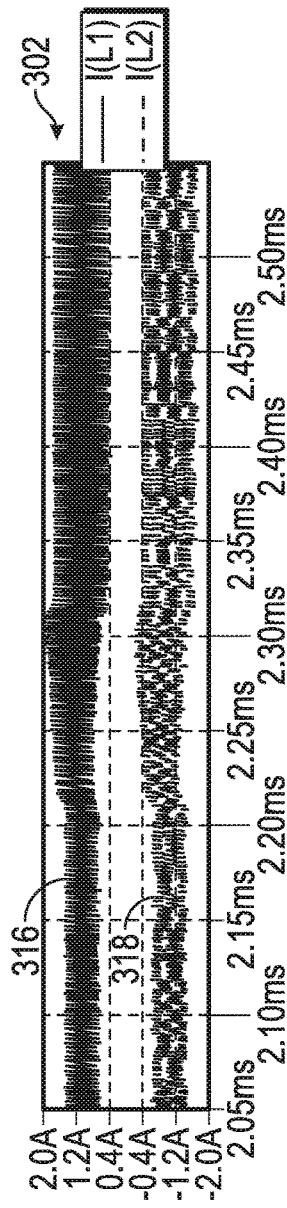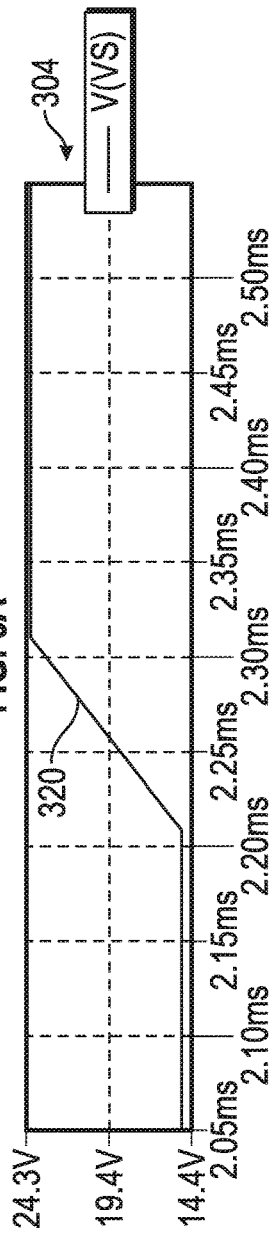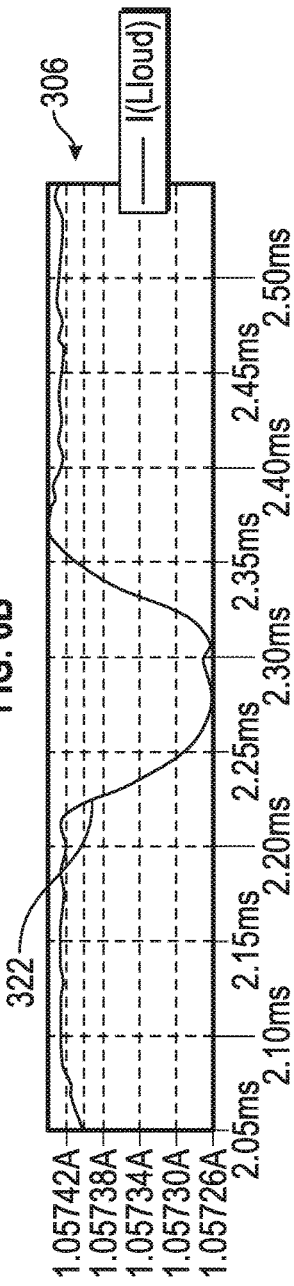
FIG. 6A
FIG. 6B
FIG. 6C

DIFFERENTIAL CONTROLLER WITH REGULATORS

FIELD OF THE DISCLOSURE

This document pertains generally, but not by way of limitation, to circuits, such as integrated circuits or sets of integrated circuits, and particularly, but not by way of limitation, to differential controller circuits.

BACKGROUND

Controller circuits are used to drive an electrical load, such as an electric motor, electric light, electric display, etc. A differential controller includes two single-ended regulators to control the current or voltage of a load. The positive and negative terminals of the load can change with respect to a reference voltage, such as ground. The outputs of the two respective regulators track one another to create the desired current or voltage at the load.

SUMMARY OF THE DISCLOSURE

Various examples described herein are directed to a differential controller comprising a first regulator and a second regulator. The first regulator receives a first regulator control signal at a first regulator input and generates a first regulator output signal at a first regulator output. The second regulator receives a second regulator control signal at a second regulator input and generates a second regulator output signal at a second regulator output. A load is electrically coupled between the first regulator output and the second regulator output. The load current and voltage are based on a difference between the first regulator output and the second regulator output.

The control signals for the respective regulators are generated separately. For example, a current sensor generates a load current signal that describes a load current at the load. A first amplifier is configured to generate the first regulator control using the load current signal and a control signal. A second amplifier is configured to generate the second regulator control signal using the first regulator input voltage and a common mode voltage.

BRIEF DESCRIPTION OF THE DRAWINGS

In the drawings, which are not necessarily drawn to scale, like numerals may describe similar components in different views. The drawings illustrate generally, by way of example, but not by way of limitation, various embodiments discussed in the present document.

FIG. 6A-6G shows the time-aligned plots of FIGS. 3A-3G over a time range illustrating more detail of the response of the simulation of the differential controller of FIG. 2 to the change in supply voltage.

DETAILED DESCRIPTION

Various examples described herein are directed to a differential controller including first and second regulators having separate inputs. In many existing differential controllers, the outputs of the first and second regulators are complimentary. That is, the input to one regulator is a complement or opposite of the input to the other regulator. This arrangement can cause discontinuities in the operation of the differential controller, for example, at start up and if the supply voltage or common mode voltage changes. This limits a differential controller, for example, in environments where the supply voltage is noisy and/or if it is desirable for the common mode voltage to change.

Differential controllers described herein address these and other challenges at least in part by providing first and second regulators having separate inputs, for example, that are separately generated. For example, inputs to the respective regulators of a differential controller can be separately generated based on feedback from the differential controller output. For example, a first regulator input can be generated based on a load current signal describing a load current generated by the differential controller. A second regulator input can be generated based on the first converter input and a common mode voltage. In this way, the various converter outputs can rise and fall separately in response to noise and load-related irregularities. A differential controller with regulators arranged in this manner may also respond more continuously to changes to the supply voltage or the common mode voltage.

In some examples, the inputs to the first and second converters are related by a compensation network including one or more active components, such as capacitors, inductors, etc. The compensation network may cause the input to the first converter to change in response to changes in the common mode voltage and may also cause the second converter input to change in response to the load current. The compensation network, in some examples, is also arranged to add to the system a zero. The zero provided by the compensation network can be positioned to cancel a pole added to the system by the load. For example, an inductive load, such as a direct current (DC) motor adds a pole that can be at a frequency within the system bandwidth.

Figure 1:
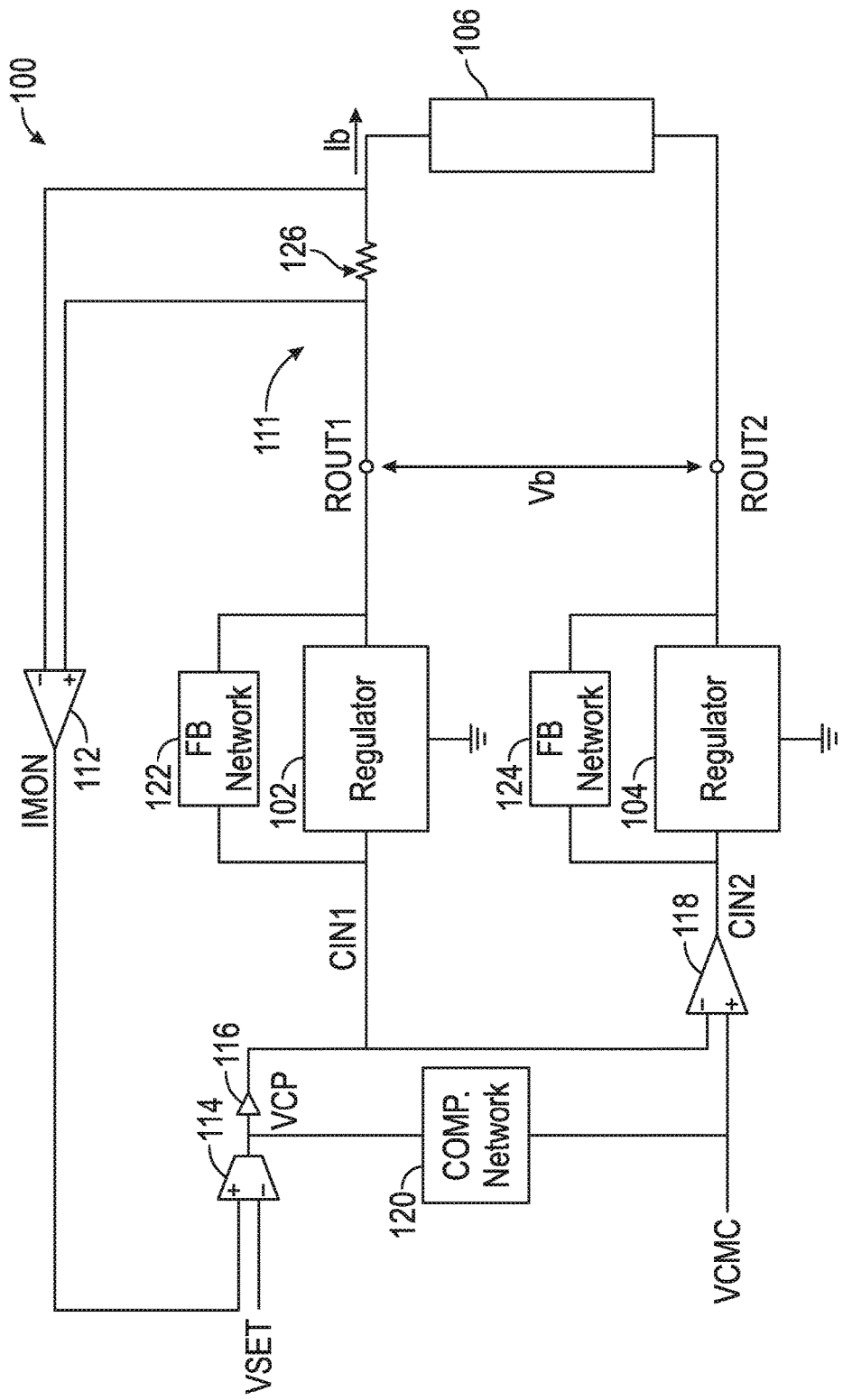
FIG. 1 is a schematic diagram showing one example of a differential controller.

FIG. 1 is a schematic diagram showing one example of a differential controller 100. The differential controller 100 comprises a first regulator 102 and a second regulator 104 that drive a load 106. The regulators 102, 104 may be or include any suitable type of regulator such as, for example, one or more switching regulator, one or more linear regulator, etc. For example, in applications where it is desirable to reduce power consumption, the regulators 102, 104 may be configured with switching regulators, such as buck converters. In applications were power consumption is not as important as a design concern, the regulators 102, 104 can be implemented with linear regulators, such as, for example, one or more amplifiers.

In the example of FIG. 1, regulators 102, 104 generate respective output signals ROUT1, ROUT2 at the outputs of the regulators 102, 104. The output signals ROUT1 and ROUT2 depend on respective control signals CIN1, CIN2 provided at control inputs of the respective regulators 102, 105. In the example of FIG. 1, the voltages of the output signals ROUT1, ROUT2 are out-of-phase (e.g., opposite in phase) relative to the control signals CIN1, CIN2. For example, an increase in the voltage of a control signal CIN1 or CIN2 results in a decrease in the voltage of the corresponding output signal ROUT1 or ROUT2. Similarly, a decrease in the voltage of a control signal CIN1 or CIN2 results in an increase of the voltage of the corresponding output signal ROUT1 or ROUT2. Arrangements with in-phase control signals and output are also contemplated and an example differential controller with in-phase control signals and outputs is described with respect to FIGS. 7 and 8.

Figure 2:
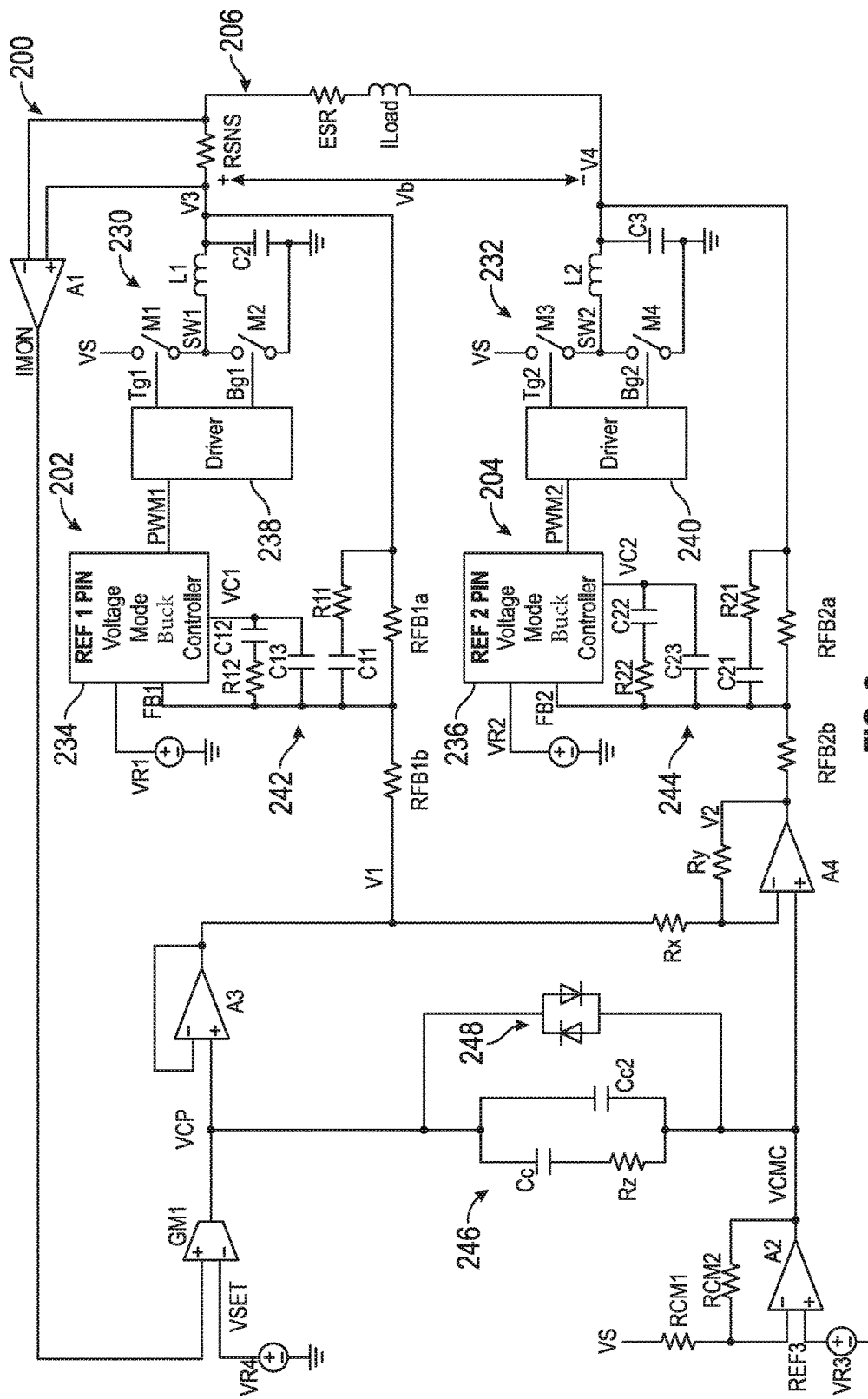
FIG. 2 is a schematic diagram showing another example of a differential controller.
Figure 3A:
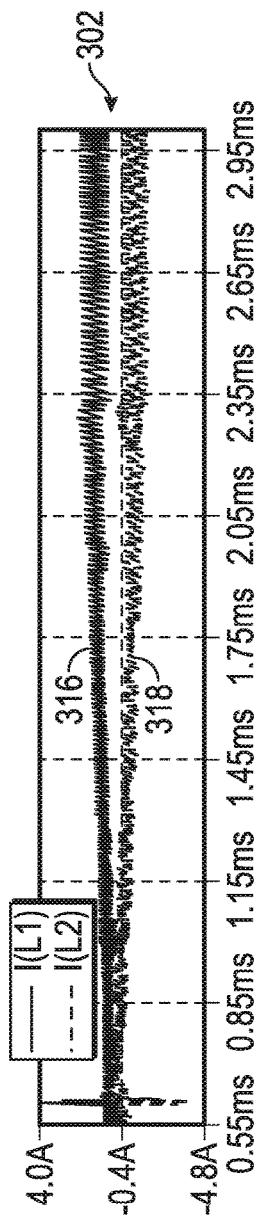
FIGS. 3A-3G shows a series of time-aligned plots illustrating the response of the simulation of the differential controller of FIG. 2 to a change in the set voltage VSET and to a supply voltage transient.
Figure 3B:
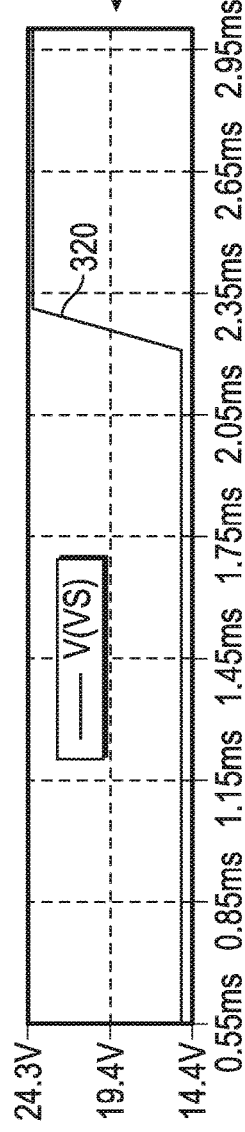
Figure 3C:
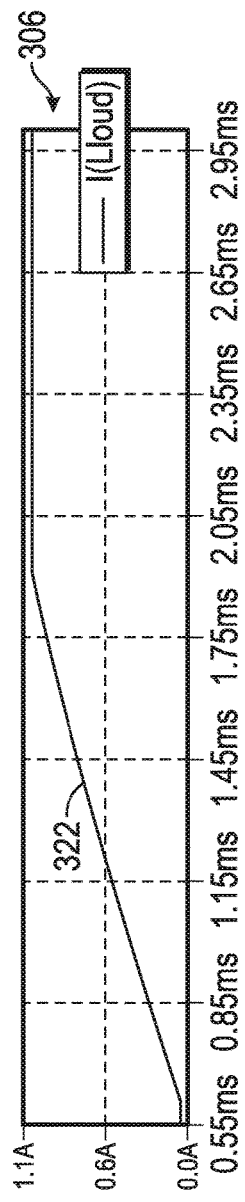
Figure 3D:
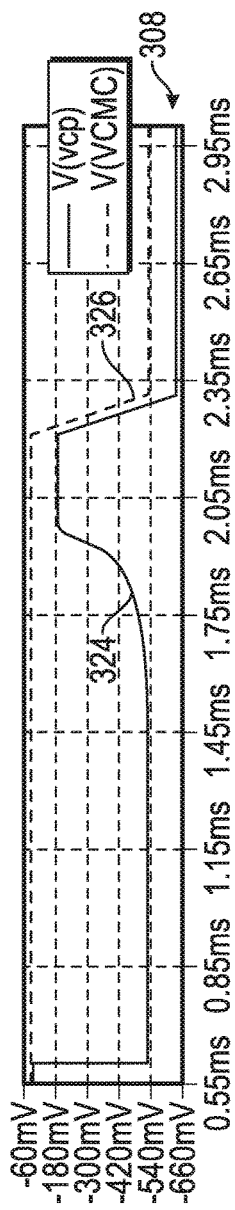
Figure 3E:
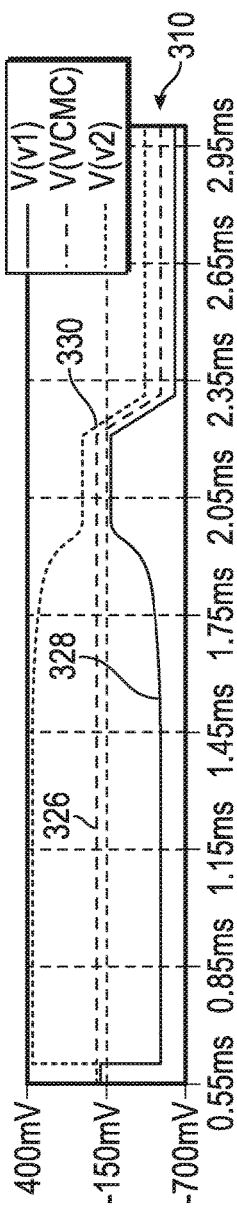
Figure 3F:
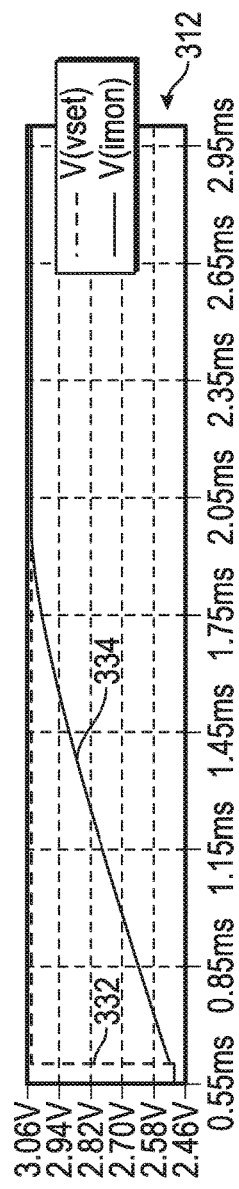
Figure 3G:
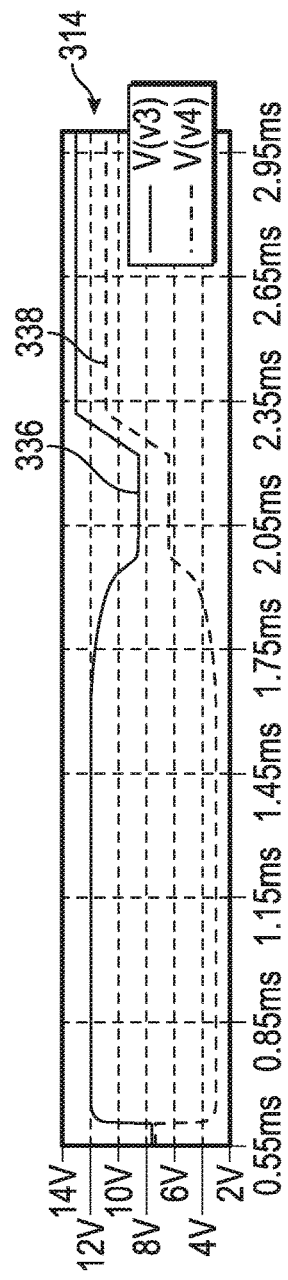

The regulators 102, 104 may include local feedback networks 122, 124 to regulate the output to the desire voltage set by the control signals CIN1 and CIN2. For example, the local feedback network 122 may be configured to provide a desired low-frequency closed-loop gain from the first control signal CIN1 to the first regulator output signal ROUT1. Similarly, the local feedback network 124 may be configured to provide a desired low-frequency closed-loop gain from the second control signal CIN2 to the second regulator output signal ROUT1. The low-frequency, closed-loop gains of the respective regulators 102, 104 may be the same or different, depending on the application. In the example of FIG. 1, the control signals CIN1, CIN2 are provided to the regulators separate from the feedback networks 122, 124. In other examples, for example, as illustrated in FIG. 2, the control signals are provided to feedback networks of the respective regulators.

A load 106 is electrically coupled between the first regulator output and the second regulator output. The output of the differential controller 100 is across the load 106 and, in the example of FIG. 1, also across a current sense resistor 126. The load current, given by Ib and load voltage, given by Vb, are based on a difference between the first regulator output signal ROUT1 and the second regulator output signal ROUT2. The load 106 can be inductive, resistive, capacitive, or combinations thereof. In some examples, the load 106 is or includes an electric motor including an inductive component and a resistive component. The load voltage Vb is (or is related to) a difference between the voltage of the first regulator output signal ROUT1 and the second regulator output signal ROUT2.

Figure 9:
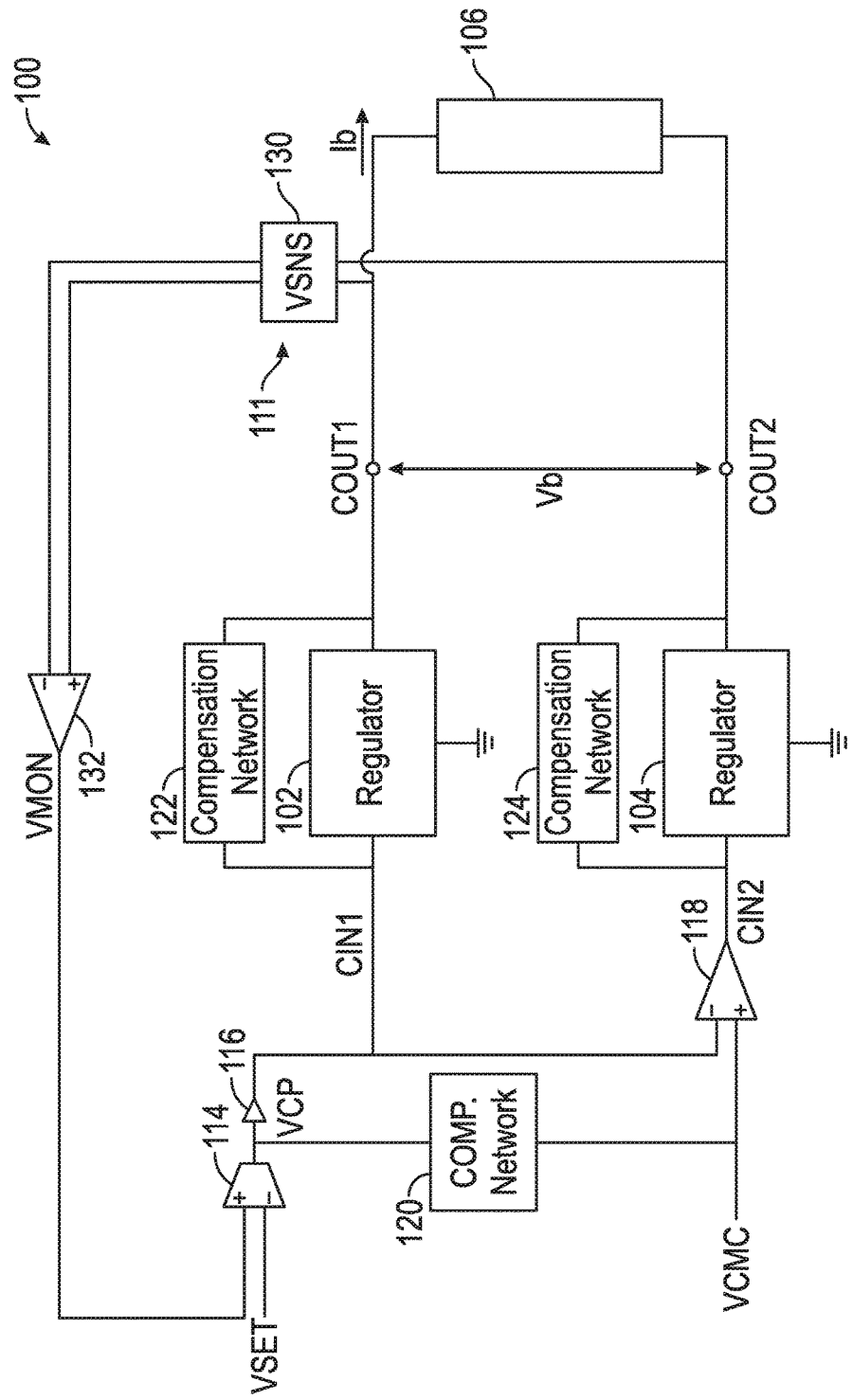
FIG. 9 is a schematic diagram showing one example of the differential controller of FIG. 1 with voltage feedback.

A feedback sensor 111 senses a condition at the load 106 to generate a feedback signal. In the example of FIG. 1, the feedback sensor 111 includes a current sensor comprising a current sense resistor 106 provided in series with the load and a current sense amplifier 112. The output of the current sense amplifier is a load current signal IMON that, in this example, is used as a feedback signal to regulate the load current Ib based on a set voltage VSET, as described herein. In other examples, the differential controller is configured to regulate the load voltage Vb based on the set voltage VSET, for example, as shown in FIG. 9 below.

Referring specifically to the example of FIG. 1, because the current sense resistor 126 is provided in series with the load 106, a voltage dropped over the current sense resistor 126 is proportional to the load current 1b. A current sense amplifier 112 is arranged to amplify the voltage drop across the current sense resistor 126 to generate a load current signal IMON. Like the voltage drop across the current sense resistor 126, the current signal IMON has a voltage that is proportional to the load current 1b. In some examples, the current sense amplifier 112 includes an offset voltage so that the zero-current output is a voltage other than 0 V.

The load current signal IMON is provided to a transconductance amplifier 114 (e.g., the non-inverting input thereof). The transconductance amplifier 114 compares the load current signal IMON to a set voltage for the differential controller 100, labeled VSET. The set voltage VSET may be provided to the inverting input of the transconductance amplifier 114. (In examples where the control signals CIN1, CIN2 are in-phase with the output signals ROUT1, ROUT2, the set voltage VSET may be provided to the non-inverting input of the transconductance amplifier 114, as described with respect to FIGS. 7 and 8.)

The transconductance amplifier 114 generates a current that is either sourced or sunk by the transconductance amplifier 114, for example, depending on a difference between the load current signal IMON and the set voltage VSET. For example, when IMON is greater than VSET, the transconductance amplifier 114 sources current to its output. When the load current signal IMON is less than VSET, the transconductance amplifier 114 sinks current from its output. A voltage VCP at the output of the transconductance amplifier 114 is provided to the first regulator 102 as the first regulator control signal CIN1. In the example of FIG. 1, the voltage VCP is conditioned by a unity gain buffer 116 before being provided to the first regulator 102 as the control signal CIN1. In this way, the set voltage VSET provides an input to the differential controller 100 such that the load current Ib tends to track the set voltage VSET.

The control CIN2 for the second regulator 104 is generated based on the first regulator control signal CIN1 and a common mode control voltage VCMC. For example, an inverting gain amplifier 118 receives the first regulator control signal CIN1 at an inverting input and the common mode control voltage VCMC at a non-inverting input. The common mode control voltage VCMC is a signal (e.g., a voltage) setting the desired common mode output voltage for the differential controller 100. In some examples, the common mode control voltage VCMC is equal to the common mode voltage of the regulator control inputs CIN1 and CIN2

The common mode output voltage is the voltage that is the average of the first regulator output signal ROUT1 and the second regulator output signal ROUT2. Consider an example where the first regulator output signal ROUT1 is at 10 V and the second regulator output signal ROUT2 is at 2 V. The differential output voltage Vb would be 8 V and the common mode output voltage would be 6 V.

In the differential controller 100 of FIG. 1, the common mode output voltage is set by the common mode control voltage VCMC. As shown, the second regulator input CIN2 is generated from an inverse of the first controller input CIN1 added to the common mode control voltage VCMC. In implementations where the common mode output voltage is to remain constant, the common mode control voltage VCMC may also be constant and/or may be variable. In some examples, described in more detail with respect to FIG. 2, the common mode control voltage VCMC is modified to track the supply voltage. This causes the common mode output voltage to also track the supply voltage. In this way, the differential controller 100 responds to changes in the supply voltage by modifying the common mode control voltage VCMC without affecting the output of the differential controller 100.

In the example of FIG. 1, the differential controller 100 also includes a compensation network 120 coupling the output voltage VCP of the transconductance amplifier 114 to the common mode control voltage VCMC. In the example of FIG. 1, the compensation network 120 is positioned between the output voltage VCP of the transconductance amplifier 114 and the common mode control voltage VCMC. The compensation network 120, in some examples, is a type-2 compensation network that has two poles and one zero. As described herein, the compensation network 120 may be arranged to position the zero to cancel an in-bandwidth pole of the load 106. For the two poles, the low frequency pole sets the dominant pole of the system loop. The high frequency pole is positioned outside of the intended system loop bandwidth. The compensation network 120 may not always be a type-2 compensation network. For example, the compensation network 120 may be a type-1 compensation network or other suitable compensation network. Arranging the compensation network 120 as a type-1 compensation, for example, may be useful in examples where the load is resistive.

Upon startup, the load current will initially be zero, driving the load current signal IMON lower than the set voltage VSET. The transconductance amplifier 114 sinks current while providing a first converter control signal CIN1 that regulates a voltage of the first converter output signal ROUT1 higher to increase the load current. The second converter control signal CIN2 is set by amplifier 118 to regulate a voltage of the second converter output signal ROUT2 lower to increase the load current.

FIG. 2 is a schematic diagram showing another example of a differential controller 200. In this example, the regulators of the differential controller 200 include two voltage-mode buck converters 202, 204. The buck converter 202 receives a first converter control signal V1 and generates a first converter output voltage V3. The buck converter 204 receives a second converter control signal V2 and generates a second converter output voltage V4. A differential output voltage Vb of the differential controller 200 appears across a load 206 and the current sense resistor RSNS. In the example of FIG. 2, the load 206 includes an equivalent series resistance ESR and a load inductance Lload. For example, the load 206 may be or include a DC electric motor.

The buck converter 202 includes a power stage 230 that comprises a high side device M1 and a low side device M2 connected in series between the supply voltage VS and ground. A terminal SW1 that is common to both the high and low side devices is connected to an inductor L1. The inductor L1 is also connected to an output capacitor C2 to form the output filter of the buck converter 202. The first converter output signal V3 appears across the output capacitor C2. The high side device M1 and low side device M2 act as switches that provide a low impedance path from the switch node SW1 to either the supply voltage VS or to ground, depending on the state of the devices M1, M2. The high side device M! and low side device M2 may be or include any suitable switching devices such as, for example, a field effect transistor (FET), a bipolar junction transistor (BJT), etc.

The states of the devices M1, M2 are controlled by a voltage mode buck controller 234 in combination with a buck driver 238. Any suitable voltage mode buck controller may be used including, for example, the LTC3861-1 product available from Analog Devices, Inc. of Norwood, Mass. The voltage mode buck converter 234 receives a reference voltage REF1 and a feedback voltage FB1 as input and generates a pulse-width modulated (PWM) control signal PWM1 as output. The control signal PWM1 is provided to the driver 238, which generates corresponding switching signals Tg1, Bg1 that are provided to the high and low side devices M1, M2. Any suitable driver may be used including, for example, the LTC4449 product available from Analog Devices, Inc. of Norwood Mass. This is just one example control arrangement for the buck converter 202. Other arrangements for driving the devices M1, M2 may be used including, for example, single chip solutions.

In the example of FIG. 2, the reference voltage REF1 is driven by a voltage source VR1 that, for example, may be derived from the supply voltage VS and/or an internal reference voltage. In the example of FIG. 2, feedback voltage FB1 for the buck converter 202 is provided by a converter feedback path that includes a type-3 compensation network 242. The type-3 compensation network includes resistors R12, R11, RFB1a, and RFB1b and capacitors C11, C12, and C13. The compensation network 242 creates two zeros around the LC tank of the inductor L1 and capacitor C2 to cancel the two poles from the LC. This may allow the buck converter 202 to operate with better phase margin. In some examples, other types of compensation networks may be used. For example, a type-2 compensation may be used to provide the feedback voltage FB1 to the buck controller 234 instead of the type-3 network shown in FIG. 2.

The buck converter 204 is arranged in a manner similar to that of the buck converter 202. For example, the buck converter 204 comprises a power stage 232 that includes a high side device M3 and a low side device M4. A terminal SW2 common to both devices M3 and M4 is coupled to the inductor L2 and capacitor C3 of the buck converter 204. A voltage mode buck controller 236 generates a pulse-width modulated output signal PWM2. A driver 240 converts the output signal PWM2 into appropriate switching signals Tg2, Bg2 for the devices M3, M4. The voltage mode buck controller 236 also receives a reference voltage REF2, driven by a voltage source VR2 and a feedback voltage FB2 that is provided via a type-3 compensation network 244. The compensation network 244 includes resistors R21, R22, RFB2a, RFB2b, and capacitors C21, C22, C23.

In the arrangement of FIG. 2, the converter output signals V3 and V4 are controlled by respective control signals V1 and V2 at the bottom of the respective compensation networks 242, 244. For example, in steady state, the feedback voltages FB1, FB2 of the buck converters 202, 204 are equal to the respective reference voltages REF1, REF2. The low frequency closed-loop gain of the buck converters 202, 204 is determined by the ratio of the respective feedback resistors. For example, the low frequency closed-loop gain of the buck converter 202 is given by Equation [1] below:

$$V3 = REF1\left(1 + \frac{RFB1a}{RFB1b}\right) - V1\frac{RFB1a}{RFB1b} \quad [1]$$

Similarly, the low frequency closed-loop gain of the buck converter 204 is given by Equation [2] below:

$$V4 = REF2\left(1 + \frac{RFB2a}{RFB2b}\right) - V2\frac{RFB2a}{RFB2b} \quad [2]$$

In this example, the −3 dB frequency of the closed-loop gain for the buck converters 202, 204 is about equal to $f_{UG}/A_{O\_BUCK}$, where $f_{UG}$ is the unity gain frequency of the closed-loop gain and $A_{O\_BUCK}$ is the low frequency closed-loop gain. In some examples, the two buck converters 202, 204 are arranged to have the same transient response. This may be accomplished by: (i) using resistors RFB1a and RFB2a that are equal; (ii) using resistors RFB1b and RFB2b that are equal; and (iii) setting the reference voltages REF1 and REF2 equal to one another.

In FIG. 2, a current sensor includes a current sense resistor RSNS and a current sense amplifier A1. The current sense resistor RSNS is connected in series with the load 206 such that the current of the current sense resistor RSNS is equal to the load current. The current sense amplifier A1 is connected across the current sense resistor RSNS. Accordingly, the load current signal IMON at the output of the current sense amplifier A1 is proportional to the voltage drop across the current sense resistor RSNS and proportional to the load current. In some examples, the current sense amplifier A1 is arranged with a DC offset. The current sense amplifier A1 may have any suitable gain. In some examples, the gain $A_{0\_IMON}$ of the current sense amplifier A1 is selected such that the load current signal IMON does not saturate the current sense amplifier A1 at the maximum expected load current.

The low frequency voltage gain from the load voltage Vb to the load current signal IMON may be given by Equation [3] below:

$$\frac{IMON}{Vb} = \frac{RSNS}{RSNS + ESR} A_{0\_IMON} \frac{1}{1 + s\frac{Lload}{(RSNS + ESR)}} \quad [3]$$

As illustrated by Equation [3], the inductance of the load Lload adds a low-frequency pole. The low frequency pole location $p_{Load}$ (load pole frequency) is related to the load inductance Lload, and the series resistors RSNS and ESR and is given by Equation [4] below:

$$p_{Load} = \frac{RSNS + ESR}{Lload} \quad [4]$$

In various examples, the relatively low frequency of this pole can cause it to be within the system bandwidth. When the pole is within the system bandwidth, it can lead to instability in the differential controller 200, absent compensation. In some examples, the pole added by the load inductance Lload is cancelled by the compensation network 246, as described herein. The current sense amplifier A1 may also have at least one pole. In various examples, however, the current sense amplifier A1 is selected to position its pole or poles outside of the system bandwidth. Accordingly, a pole or poles of the current sense amplifier A1 may not have a significant impact on the differential controller 200.

The load current signal IMON is provided to a transconductance amplifier GM1, which also receives a set voltage VSET. In this example, VSET is driven by a voltage source VR4. In examples in which the differential controller 200 drives a DC motor, the set voltage VSET may be provided by a microcontroller or other system component and may be proportional to a desired speed for the motor.

The transconductance amplifier GM1 produces an output current that is proportional to a difference between the set voltage VSET and the load current signal IMON. In this arrangement, the load current signal IMON is provided to the noninverting input of the transconductance amplifier GM1 and the set voltage VSET is provided to the inverting input of the transconductance amplifier GM1. The transconductance amplifier GM1 sinks or sources a current depending on the comparison between the load current signal IMON and the set voltage VSET.

A compensation network 246 is connected between the output of the transconductance amplifier GM1 and the common mode control voltage VCMC. A voltage VCP at the output of the transconductance amplifier GM1 may depend on the current sunk or sourced by the transconductance amplifier GM1 and the compensation network. When the common mode control voltage VCMC is constant, the small signal gain from the load current signal IMON to the voltage VCP is given by Equation [5] below:

$$\frac{Vcp}{IMON} = gm1\frac{ro}{(1 + s \cdot Cc \cdot ro)}\frac{(1 + s \cdot Rz \cdot Cc)}{(1 + s \cdot Rz \cdot Cc2)} \quad [5]$$

In Equation [5], gm1 is the transconductance of the transconductance amplifier GM1 and ro is the small signal output impedance of the transconductance amplifier GM1. Resistor Rz and capacitors Cc and Cc2 are part of the compensation network 246. Equation [5] has one zero and two poles, showing that the compensation network 246 is a type-2 compensation network.

The loop gain of the differential controller 200 may be found by considering the gains around a loop of the system, as given by Equations [6a] and [6b] below:

$$T = \frac{IMON}{Vb}\frac{Vb}{Vcp}\frac{Vcp}{IMON} \quad [6a]$$

$$T = 2\frac{RFB1a}{RFB1b}gm1 \cdot ro\frac{RSNS}{RSNS + ESR} \cdot A_{0\_IMON}$$
$$\frac{1}{(1 + s \cdot Cc \cdot ro)}\frac{(1 + s \cdot Rz \cdot Cc)}{(1 + s \cdot Rz \cdot C2)}\frac{1}{1 + s\frac{Lload}{(RSNS + ESR)}} \quad [6b]$$

Equations [6a] and [6b] show that the differential controller 200 has three poles and one zero. The zero is located at a frequency $f_{z1}$ given by Equation [7] below:

$$f_{z1} = \frac{1}{2\pi RzCc} \quad [7]$$

The values of the resistor Rz and the capacitor Cc of the compensation network 246 may be chosen to place the system zero at the frequency of the pole associated with the load inductance (Equation [4] above). This leaves the example differential controller 200 with two poles. A dominant pole is associated with the capacitor Cc and the small signal output impedance ro of the transconductance amplifier GM1. A secondary pole is associated with the resistor Rz and the capacitor C2.

The closed-loop −3 db frequency of the buck converters 202, 204 may be beyond the system crossover frequency of the differential controller 200 and may be greater than the secondary pole frequency. In some examples, where the differential controller 200 is to have a phase margin of greater than 45 degrees, the location of the secondary pole may be placed at or greater than the unity gain frequency. When the differential controller 200 has a single pole roll off, the system loop unity gain frequency is equal to the DC loop gain times the frequency of the dominant pole and is given by Equation [8] below:

$$f_{ug} = 2 \frac{RFB1a}{RFB1b} \frac{RSNS}{RSNS + ESR} \cdot A_{0\_IMON} \frac{gm1}{2\pi Cc} \quad [8]$$

The differential controller 200 includes amplifiers A3, A4 that generate respective control signals V1, V2. The amplifier A3 may be configured as a unity gain buffer such that the control signal V1 is equal to the voltage VCP. Amplifier A4 may be configured as an inverting amplifier with a closed-loop gain equal to −Ry/Rx. The voltage difference between control signals V1 and V2 is dependent on the voltage difference between VCP and VCMC and is given by:

$$V1 - V2 = \left(1 + \frac{Ry}{Rx}\right) \cdot (VCP - VCMC) \quad [9]$$

When the gain of the amplifier A4 is unity (e.g., Ry=Rx), the common mode voltage of the control signals V1 and V2 is equal to the common mode control voltage VCMC. When the voltage of control signal V1 is above the common mode control voltage VCMC, V2 is below VCMC by the same amount. When the value of resistors Ry and Rx are equal, changes in VCP will change the differential voltage of V1 and V2 but the common mode voltage of the control signals V1 and V2 remain the same and equal to VCMC. This special condition allows the controller to have independent control over the differential and common mode output voltage. In some examples, the values of the resistors Ry and Rx may be different. When Ry is not equal to Rx, the common mode voltage of the control signals V1 and V2 will change with the VCP voltage. The amplifiers A3 and A4 may be arranged such that any poles introduced by A3 and A4 are beyond the system bandwidth and, therefore, amplifiers A3 and A4 may not have a significant effect on the system loop.

The load current of the differential controller 200 tracks the set voltage VSET using negative feedback that drives the load current signal IMON and the set voltage VSET to equal. For example, the transconductance amplifier GM1 drives the load current signal IMON and the set voltage VSET equal through negative feedback by sinking or sourcing current at the output of the transconductance amplifier GM1.

In this arrangement, when the load current signal IMON is higher than the set voltage VSET, the transconductance amplifier GM1 sources current, which increases the voltage VCP. When VCP rises, the first converter control signal V1 increases at the same time that the second converter control signal V2 decreases. From Equations [3] and [4], if the control signals V1 and V2 increase, the converter output signals V3, V4 decrease. Accordingly, an increase in the control signal V1 and a decrease in the control signal V2 causes the converter output voltage V3 to fall and the converter output voltage V4 to rise. This decreases the output voltage Vb, which reduces the load current, leading to a reduction in the voltage drop across the current sense resistor RSNS. This causes the load current signal IMON to fall until the load current signal IMON and the set voltage VSET are equal.

In this example arrangement, a load current signal IMON higher than a zero-current level may represent a load current flowing from V3 to V4 and a load current signal IMON lower than the zero current level represents a load current flowing from V4 to V3. (A zero-current level is the IMON level (e.g., voltage) that occurs when the load current is zero. This may be zero volts, or a different value if the amplifier A1 has an offset.) When the load current signal IMON is at a zero-current level, the load current is zero and the steady state voltage of the converter output signals V3 and V4 are equal and at the common mode output voltage. For the voltages of the converter output signals V3 and V4 to be the same, control signals V1, V2 are the same, meaning that voltage VCP is equal to the common mode control voltage VCMC.

In some examples, optional clamping diodes 248 are coupled between VCP and VCMC as shown to limit the difference between VCP and VCMC to no more than one diode, e.g., 0.7 V. The clamping diodes 248, when present, may limit the maximum differential voltage between VCP and VCMC. This also clamps the maximum differential output of the buck converters 202, 204. Clamping the maximum differential output of the buck converters 202, 204 may prevent the buck converters 202, 204 from hitting the rail of the supply voltage VS. Hitting the supply voltage VS may cause the buck converters 202, 204 to run opened loop and ring at the LC tank frequency. Although FIG. 2 shows a particular clamping circuit using diodes, other clamping circuits could be used. For example, the clamping circuit could be implemented in other ways such as using 2 series diodes to clamp VCP and VCMC to no more than 2 diode voltages.

When the set voltage VSET is biased to above the zero-current load current signal IMON, the steady state load current is flowing in the positive direction. The load current is sourced by the first buck converter 202 and sunk by the second buck converter 204. Accordingly, the first converter output voltage V3 is greater than the second converter output voltage V4. In the arrangement of FIG. 2, this means that the first converter control signal V is lower than the second converter control signal V2 (see Equations [3] and [4] above). Accordingly, the transconductance amplifier output voltage VCP is less than the common mode control voltage VCMC. In steady state, the transconductance amplifier GM1 outputs zero amps and the voltage drops across the capacitors Cc and Cc2 are equal to the difference between VCP and VCMC.

Although the common mode output voltage may be set to a constant value, in some examples, the common mode output voltage is variable. In the example differential controller 200 of FIG. 2, the common mode output voltage depends on the VCMC voltage driven by the common mode amplifier A2. Amplifier A2 is configured as an inverting gain amplifier and its output varies with the supply voltage VS. In this example, when the supply voltage VS increases, VCMC decreases. Because VCP is coupled to VCMC through the compensation network 246, when VCMC decreases, VCP also decreases. The transconductance amplifier GM1 may be selected with a high output impedance to allow VCP to move freely with VCMC. Suppose the system is in steady state and the input voltage changes to a higher level. Ideally, the converter output signals V3 and V4 should move to a new common mode output voltage while maintaining the same differential output voltage to keep the load current unchanged. If the controller output voltage Vb is to be kept the same throughout the transient, then the voltage difference between control signals V1 and V2 stays the same throughout the transient, which means that the voltage difference between VCP and VCMC is not changed. For the common mode output voltage to transition to the new value, both voltages VCP and VCMC move down together by the same amount. According to Equation [9], if VCMC changes but the voltage difference VCP-VCMC does not, the voltage difference V1-V2 will remain unchanged. As described herein, this makes the differential controller 200 more robust in response to supply voltage transients and other changes to the supply voltage VS.

The common mode amplifier A2 generates the common mode control voltage VCMC from the supply voltage VS and a common mode reference voltage REF3 driven by a voltage source VR3. A gain of the common mode amplifier A2 is determined by resistors RCM1 and RCM2 and is given by Equation [10] below:

$$Vcmc = -\frac{RCM2}{RCM1}VS + \left(1 + \frac{RCM2}{RCM1}\right)REF3 \quad [10]$$

In this arrangement, the common mode control voltage VCMC changes during operation of the differential controller 200 as the supply voltage VS changes. In some examples the common mode output voltage may be positioned at half of the supply voltage VS to maximize the differential output voltage range across the load.

This can be done by substituting VS/2 for V3 in Equation [1] and VCMC for V1. The resistor ratio RCM2/RCM1 and the reference voltage REF3 for the common mode output voltage at VS/2 is given by Equations [11] and [12] below:

$$\frac{RCM2}{RCM1} = \frac{RFB1b}{2RFB1a} \quad [11]$$

$$REF3 = \left(1 + \frac{RFB1b}{2RFB1a + RFB1b}\right)REF1 \quad [12]$$

As shown, an increase in the supply voltage VS will cause the common mode control voltage VCMC to decrease, which causes the converter output signals V3 and V4 to rise.

The compensation network between VCP and VCMC in FIG. 2 allows the differential controller to have a better transient response when the common mode output voltage changes. Consider an example in which the differential controller 200 is in steady state and a transient in the supply causes the supply voltage VS to change to a higher level. The differential controller 200 may respond by moving to a new common mode output voltage while maintaining the same differential output voltage Vb. When the supply voltage VS increases, the common mode amplifier A2 drives the common mode control voltage VCMC down. Because the transconductance amplifier output voltage VCP is coupled to the common mode control voltage VCMC through the compensation network 246, VCP moves down by an amount equal to the reduction in VCMC. The coupling between VCP and VCMC may allow VCP to transition to a new position without the transconductance amplifier GM1 driving VCP.

The complementary reductions in the common mode control voltage VCMC and the transconductance output voltage VCP drive the control signals V1, V2 down by an amount proportional to the increase in the supply voltage VS. Because VCMC and VCP are reduced by the same amount, the difference between the control signals V1, V2 remains constant. Accordingly, the converter output signals V3, V4 both rise, but the difference between the converter output signals V3, V4 (e.g., the differential output voltage Vb) remains the same.

The differential controller 200 of FIG. 2 was simulated using the simulator LTSpice available from Analog Devices of Norwood, Mass. In the simulator, the transconductance amplifier GM1 was implemented utilizing the LT1228 product available from Analog Devices of Norwood, Mass. The transconductance of the transconductance amplifier GM1 was set to 500 uS using an appropriate voltage divider and diode circuit. The two voltage mode buck controllers 234, 236 were simulated with a single example of the LTC3861-1 product, available from Analog Devices of Norwood, Mass. The LTC3861-1 product provides two channel PWM outputs. The respective reference voltages REF1, REF2 were provided by the fixed 0.6 V internal reference of the LTC3861-1 product. The PWM outputs of the LTC3861-1 provide the PWM1 and PWM2 signals to the buck drivers 238, 240. Buck drivers 238, 240 were simulated using the LTC4449 N-Channel MOSFET driver product available from Analog Devices of Norwood, Mass. The load 206 was modeled by a 10 mH inductor, representing Lload, in series with a 2Ω resistor, representing ESR.

The current sense resistor RSNS was modeled as a 15 mΩ. The current sense amplifier A1 was simulated with an LTC6104 current sense amplifier product and an LT1004-2.5 voltage reference product, both available from Analog Devices of Norwood, Mass. The LTC6104 generates an output current proportional to the voltage across the current sense resistor RSNS. The LT1004 includes a 2.5 V Zener diode that formed a shunt regulator to provide the zero-load current IMON voltage. In the simulated example, the gain from the voltage across the current sense resistor RSNS was simulated at about 36.6 V/v. Amplifiers A2, A3, and A4 were simulated using the product LT1802 available from Analog Devices of Norwood, Mass.

FIGS. 3A-3G shows a series of time-aligned plots 302, 304, 306, 308, 310, 312, 314 illustrating the response of the simulation of the differential controller 200 described above to a change in the set voltage VSET and to a supply voltage VS transient. Plot 302 (FIG. 3A) shows current versus time for the current of the inductor L1 of the first buck converter 202 (curve 316) and the current of the inductor L2 of the second buck converter 204 (curve 318). The plot 304 (FIG. 3B) shows voltage versus time for the supply voltage VS (curve 320). The plot 306 (FIG. 3C) shows current versus time for the load current (curve 322). The plot 308 (FIG. 3D) shows voltage versus time for the transconductance amplifier output voltage VCP (curve 324) and the common mode control voltage VCMC (curve 326). The plot 310 (FIG. 3E) shows voltage versus time for the common mode control voltage VCMC (curve 326), the first converter control signal V1 (curve 328), and the second converter control signal (curve 330). Plot 312 (FIG. 3F) shows voltage versus time for the set voltage VSET (curve 332) and the load current signal IMON (curve 334). Plot 314 (FIG. 3G) shows voltage versus time for the first converter output V3 (curve 336) and the second converter output V4 (curve 338).

Figure 4A:
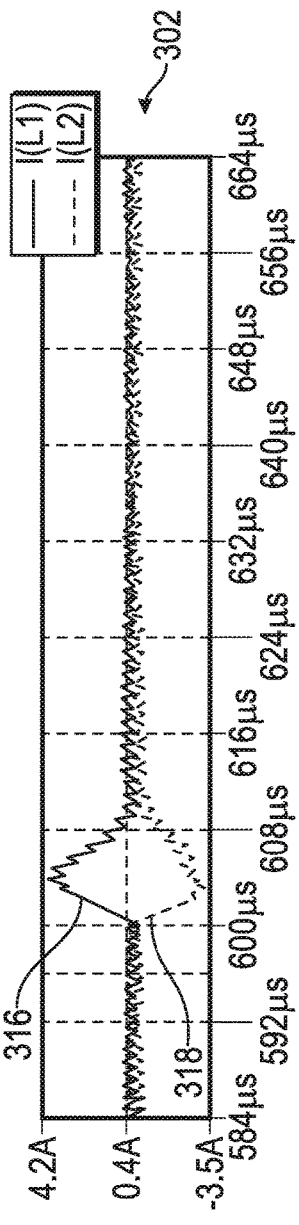
FIG. 4A-4G shows the time-aligned plots of FIGS. 3A-3G over a time range illustrating more detail of the response of the simulation of the differential controller of FIG. 2 to the change in the set voltage VSET.
Figure 4B:
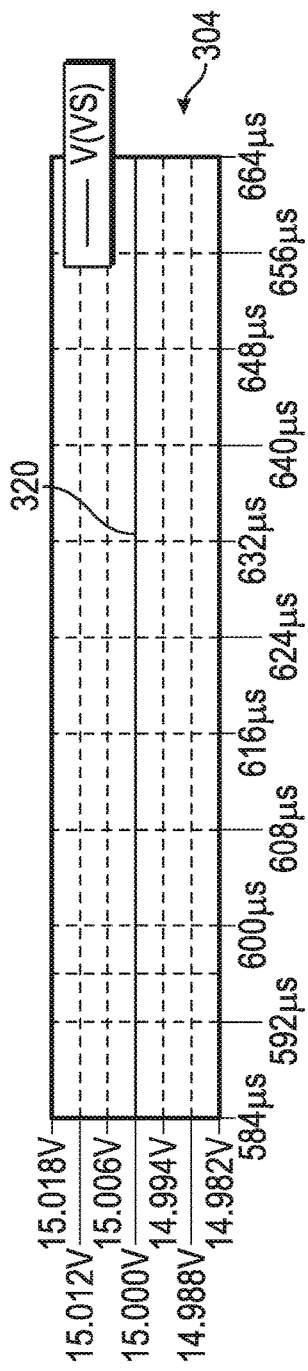
Figure 4C:
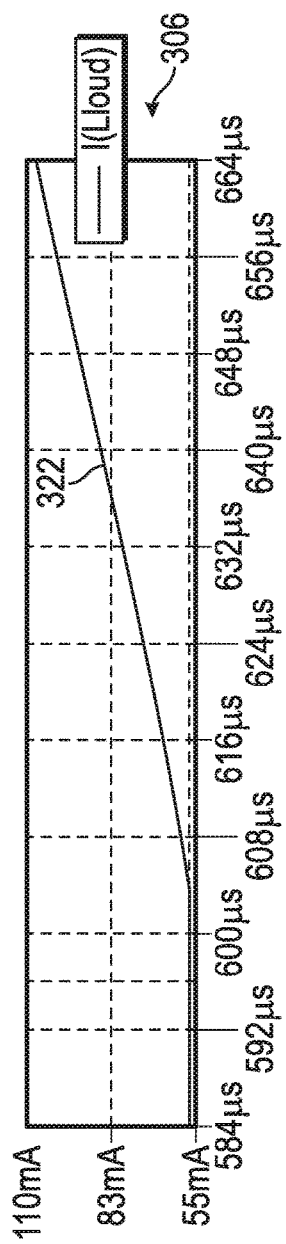
Figure 4D:
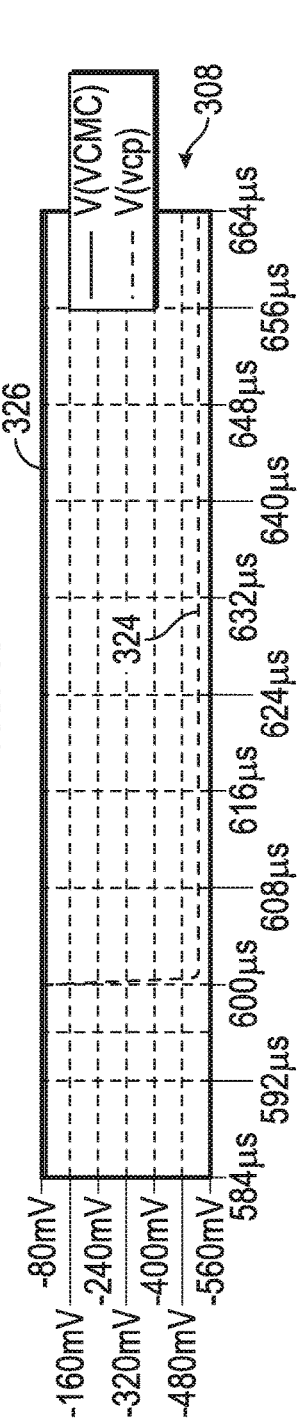
Figure 4E:
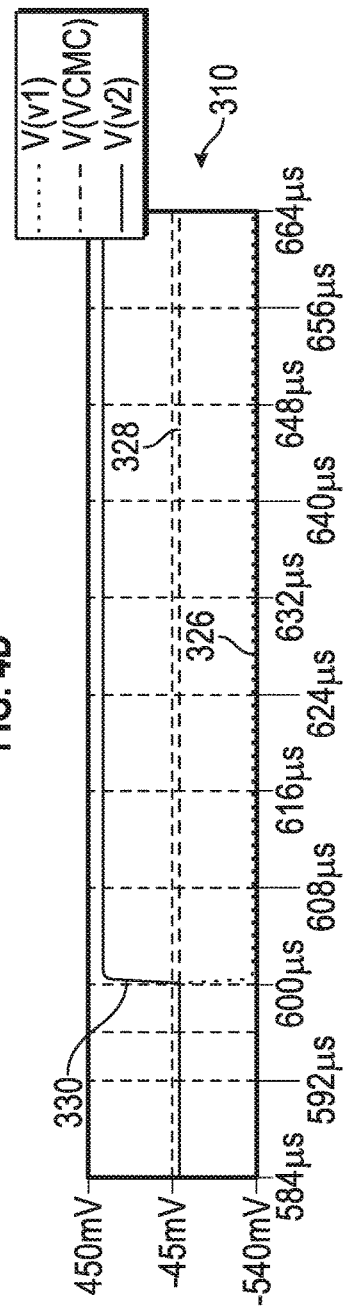
Figure 4F:
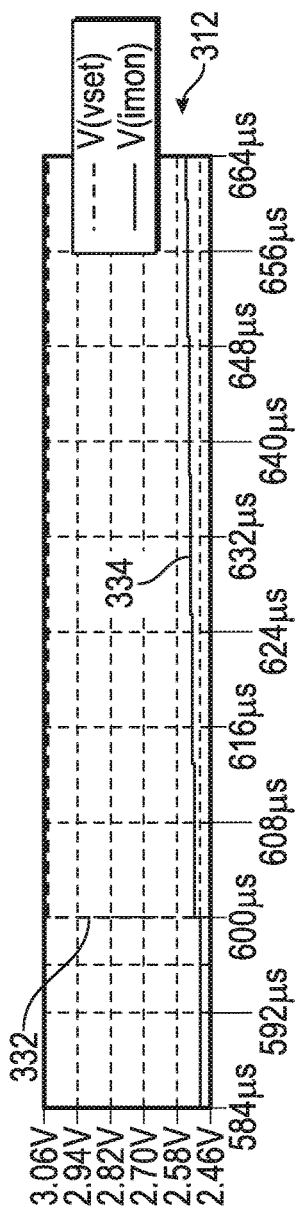
Figure 4G:
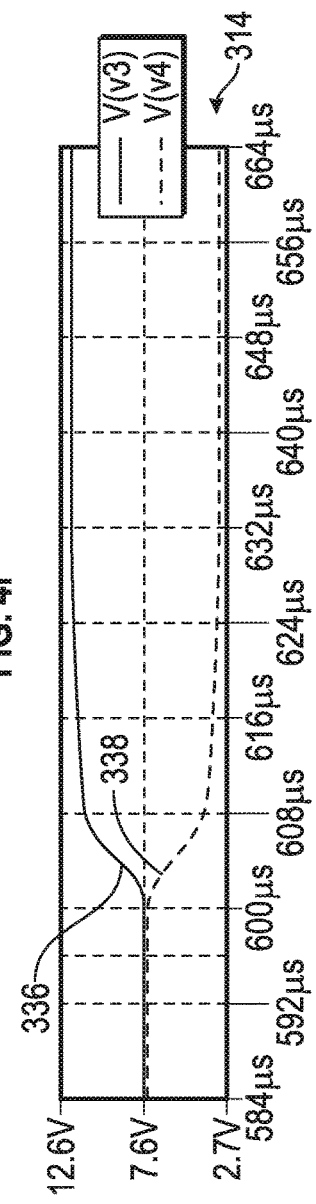

A change in the set voltage VSET occurs at about 580 us. FIG. 4 shows the time-aligned plots 302, 304, 306, 308, 310, 312, 314 of FIGS. 3A-3G over a time range illustrating more detail of the response of the simulation of the differential controller 200 described above to the change in set voltage VSET. Plot 302 is shown at FIG. 4A. Plot 304 is shown at FIG. 4B. Plot 306 is shown at FIG. 4C. Plot 308 is shown at FIG. 4D. Plot 310 is shown at FIG. 4E. Plot 312 is shown at FIG. 4F. Plot 314 is shown at FIG. 4G.

At about 580 us, the load current (curve 322 of plot 306) is settled at about 56 mA and the load current signal IMON (curve 334 of plot 312) is regulated equal to the set voltage VSET (curve 332 of plot 312). At about 600 us, the set voltage VSET transitions from 2.5 V to 3.06 V, commanding a higher load current. This results in a divergence between the set voltage VSET and the load current signal IMON. In response, the transconductance amplifier GM1 drives its output voltage VCP down to increase the voltage across the load 206. In examples where the transconductance output voltage VCP is clamped to one diode below the common mode control voltage VCMC, the changes in VCMC (curve 326 of plot 308 and plot 310), the first converter input V1 (curve 328 of plot 310) and the second converter input V2 (curve 328 of plot 310) occur close in time to the change in the set voltage VSET. The outputs of the converters V3 (curve 336 of plot 314) and V4 (curve 338 of plot 314) ramp up at a slower rate in response to the changes in the control signals V1 and V2. The first converter output V3 settles at 11.9 V and the second converter output settles at 3.1 V. Here, the common mode output voltage is 7.5 V, which is half of the supply voltage of 15 V. The load current (curve 322 of plot 306) similarly ramps up.

Figure 5A:
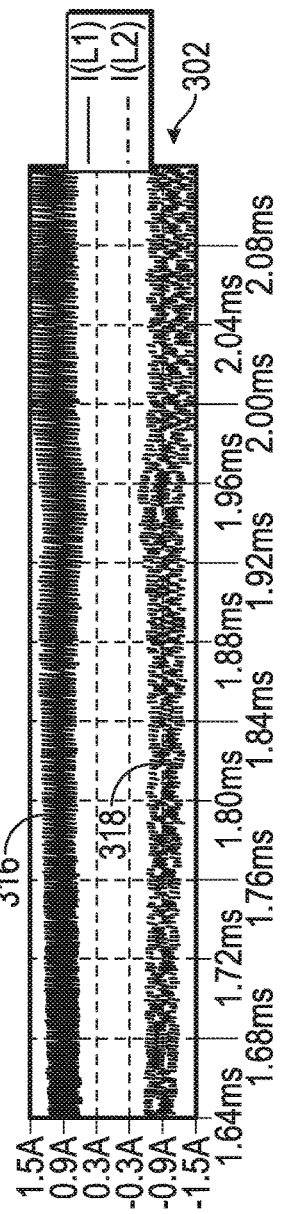
FIG. 5A-5G shows the time-aligned plots of FIGS. 3A-3G over a time range illustrating more detail of the response of the simulation of the differential controller of FIG. 2 in settling after the change in the set voltage VSET.
Figure 5B:
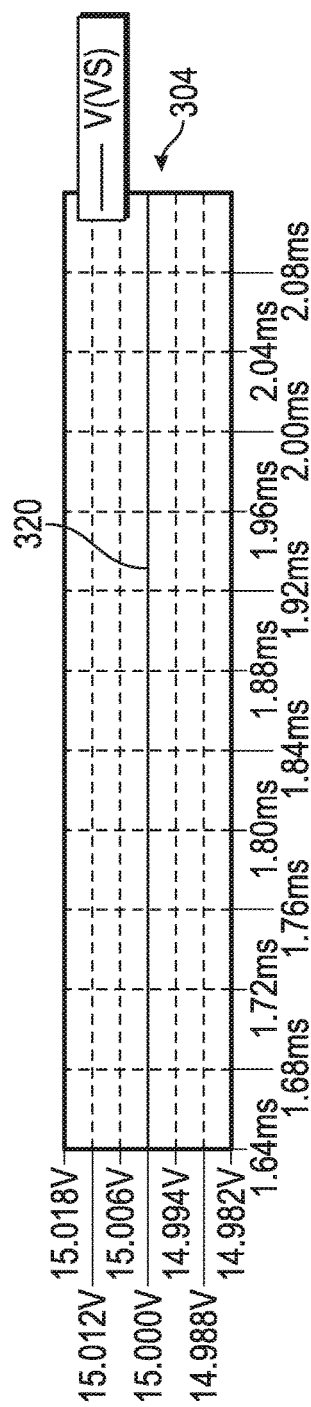
Figure 5C:
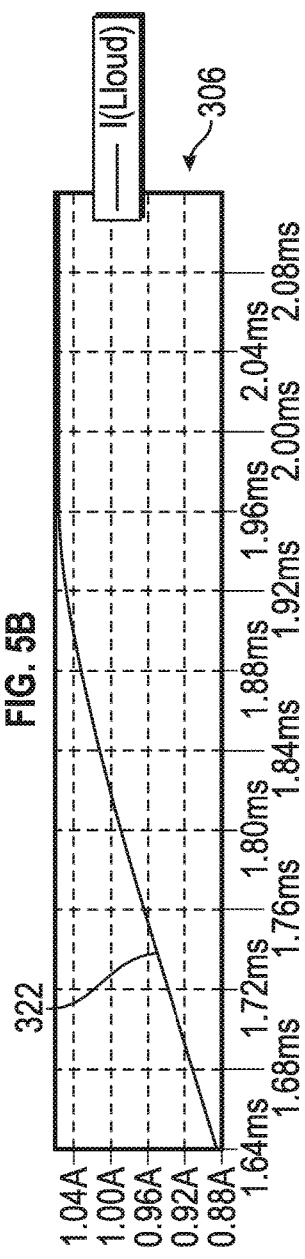
Figure 5D:
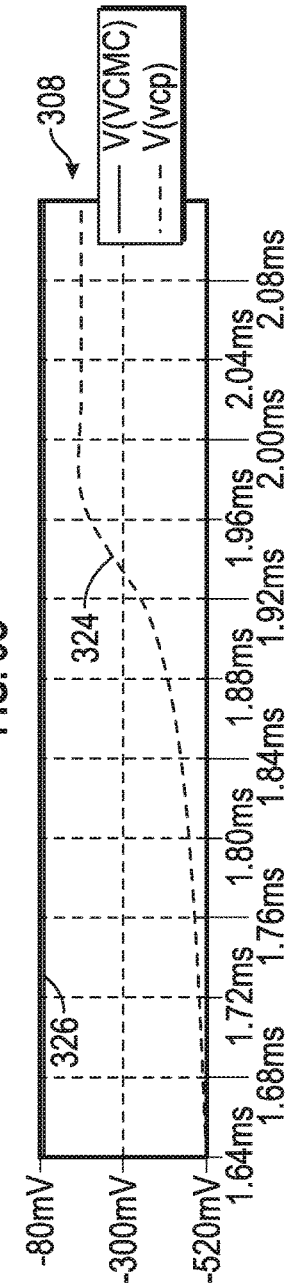
Figure 5E:
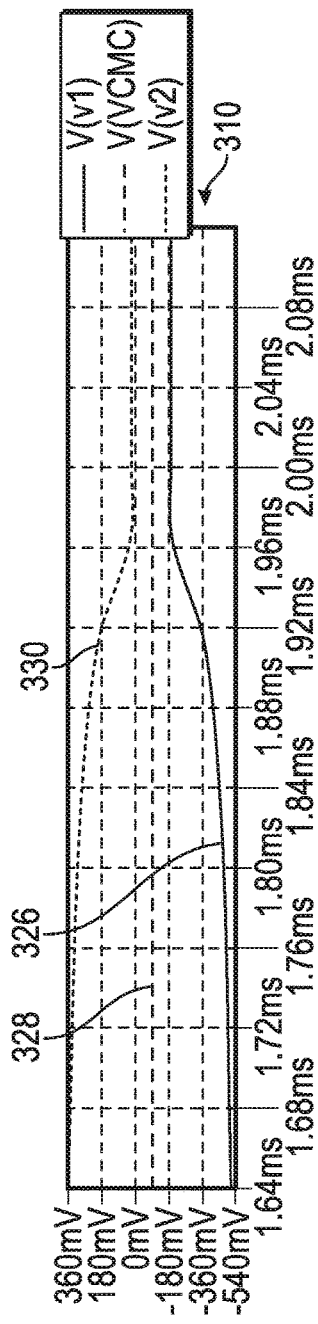
Figure 5F:
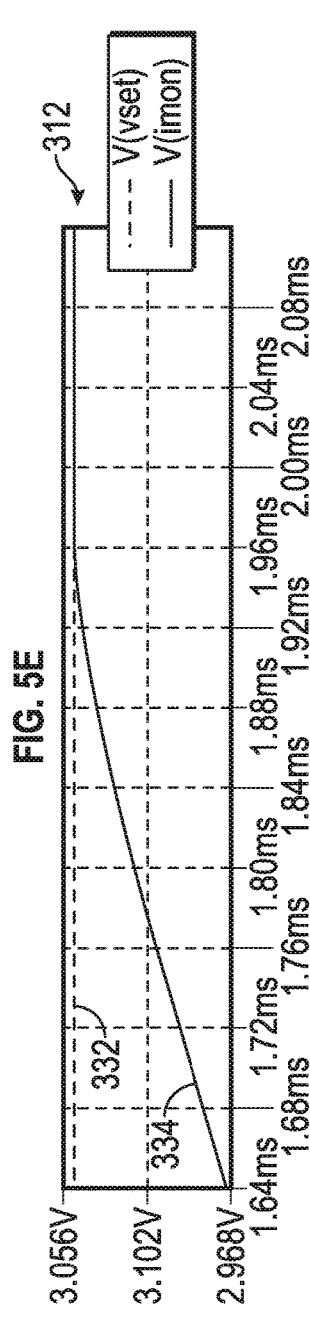
Figure 5G:
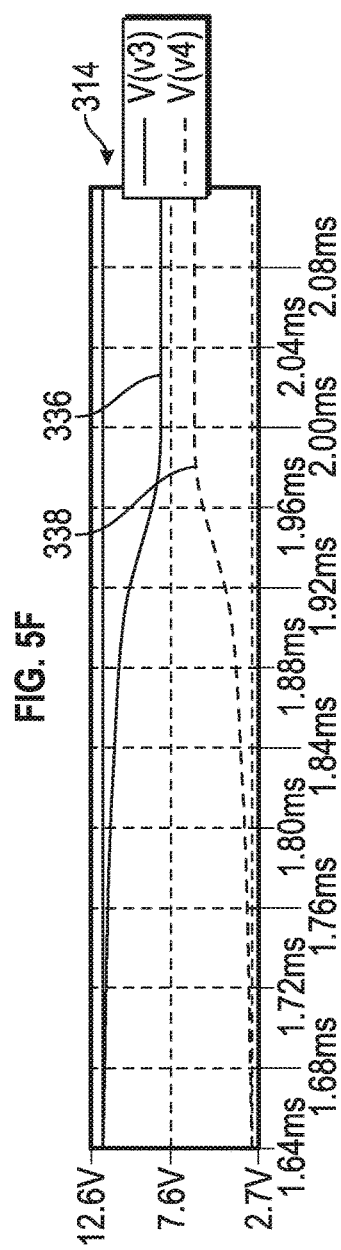
Figure 6D:
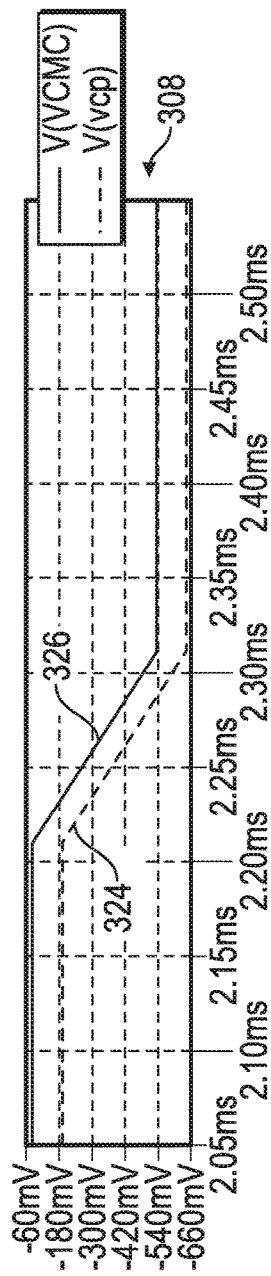
Figure 6E:
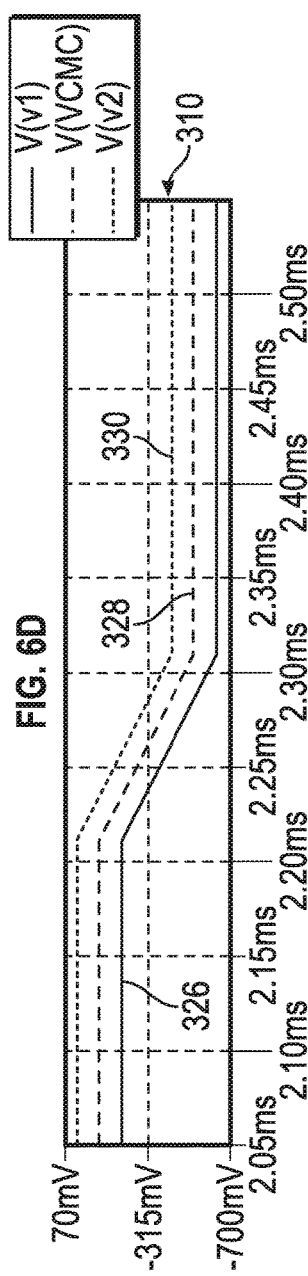
Figure 6F:
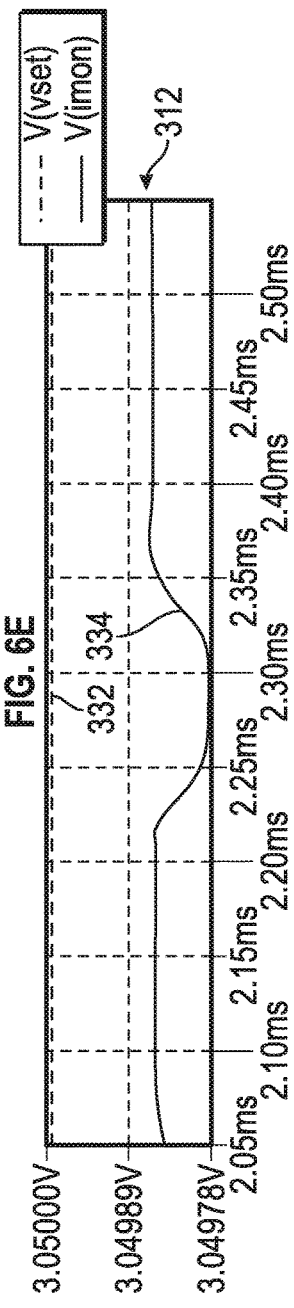
Figure 6G:
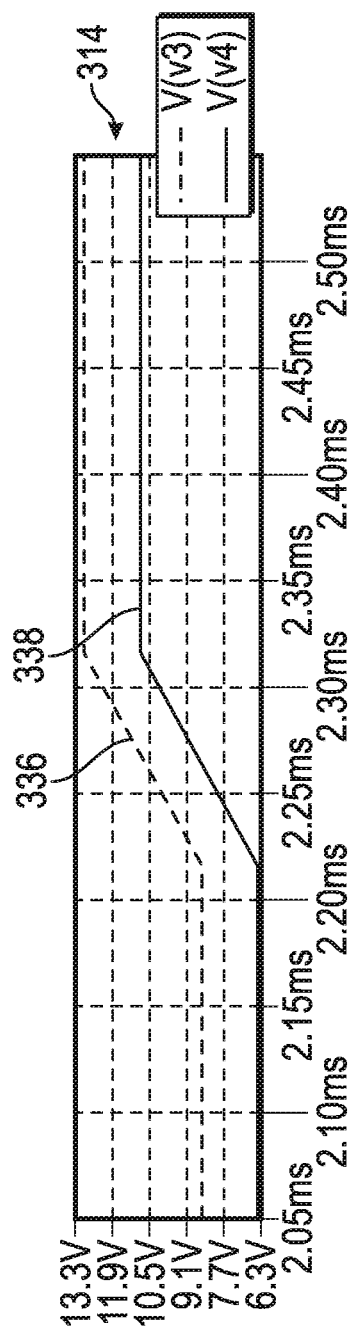

By about 1.95 ms, the load current ramps up to the regulation level and the load current signal IMON approaches the set voltage VSET. This is shown in more detail at FIGS. 5A-5G, which shows the time-aligned plots 302, 304, 306, 308, 310, 312, 314 of FIGS. 3A-3G over a time range illustrating more detail of the response of the simulation of the differential controller 200 in settling after the change in set voltage VSET. Plot 302 is shown at FIG. 5A. Plot 304 is shown at FIG. 5B. Plot 306 is shown at FIG. 5C. Plot 308 is shown at FIG. 5D. Plot 310 is shown at FIG. 5E. Plot 312 is shown at FIG. 5F. Plot 314 is shown at FIG. 5G.

As shown, the difference between IMON and VSET becomes smaller, reducing the differential output voltage by increase VCP. As VCP rises, the control signals V1 and V2 come together and the difference between the converter outputs V3, V4 also becomes smaller. Because the dominant pole is set by the load inductor and the controller is working much faster in response to the load current signal (MON), the load current settles to the new level without overshoot.

At about 2.3 ms, a supply voltage transient causes the supply voltage VIN to change from 15 V to 24 V. FIG. 6 shows the time-aligned plots 302, 304, 306, 308, 310, 312, 314 of FIG. 3 over a time range illustrating more detail of the response of the simulation of the differential controller 200 described above to the change in supply voltage VIN. The common mode amplifier A2 drives the common mode control voltage VCMC down in response to the change in the supply voltage VIN. As VCMC decreases, it pulls VCP down through the compensation network 246. This coupling between VCMC and VCP allows the common mode output voltage to change while maintaining the differential output voltage Vb. In response to the downward change in VCMC and VCP, the converter outputs V3, V4 move up together to a new common mode output voltage of 12 V, which is the new supply voltage divided by two.

In the simulated implementation, the transconductance amplifier GM1 utilizes a negative supply rail to provide the appropriate control voltages VCP, VCM, V1, V2. The negative supply rail was used because the reference voltages REF1, REF2 for the buck converters 202, 204 were simulated at 0.6 V and the closed loop gain of the buck converters 202, 204, as simulated, was not high enough to take the converter outputs V3, V4 all the way to the positive supply rail when the control signals V1, V2 are at ground. If the input voltage is lower, or higher internal references are used for REF1, REF2, the converter outputs V3, V4 can be at the positive supply rail with the control signals V1, V2 above ground. Also, in some examples, a higher closed-loop gain may make the negative supply rail unnecessary; however, a higher closed-loop gain also leads to a lower −3 dB frequency, which reduces the system bandwidth for the same phase margin.

Figure 7:
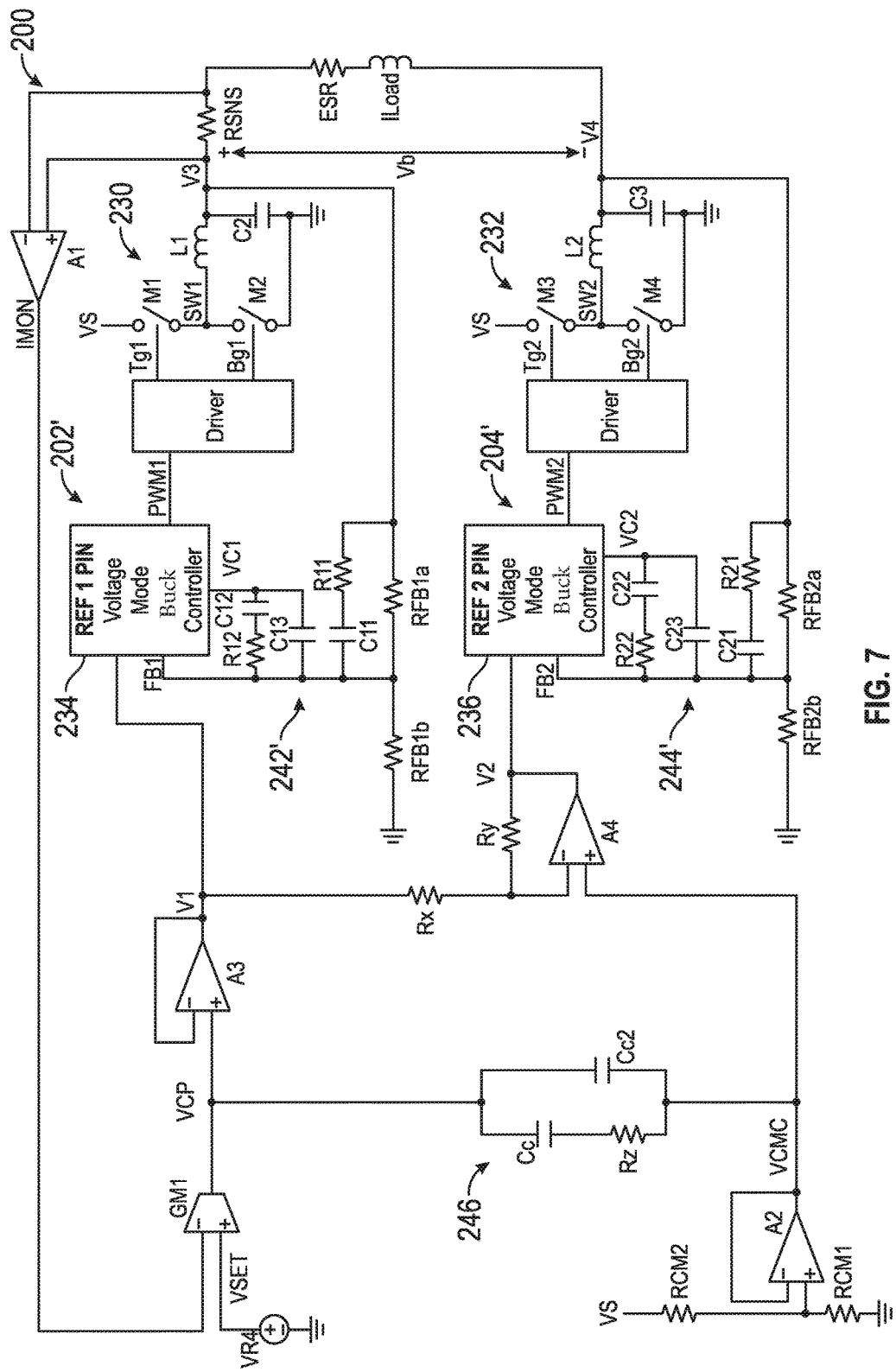
FIG. 7 is a schematic diagram showing another example of the differential controller of FIG. 2 configured to provide the control signals and at the reference voltage inputs of the voltage mode buck controllers.

FIG. 7 is a schematic diagram showing another example of the differential controller 200 of FIG. 2 configured to provide the control signals V1 and V2 at the reference voltage input pins REF1, REF2 of the voltage mode buck controllers 234, 236. Accordingly, the output of the amplifier A3, which provides V1, is connected directly to a first reference input to the voltage-mode buck controller 234. Similarly, the output of amplifier A4, which provides V2, is provided directly to the voltage mode buck controller 236. In this example, the buck converters 202', 204' are configured with compensation networks 242', 244' connected to ground. The buck reference voltage input pins REF1, REF2 are driven by amplifiers A3 and A4, respectively, to provide control signals V1 and V2.

With the control signals V1, V2 provided at the reference voltage input pins REF1, REF2, the control signals V1, V2 and converter outputs V3, V4 are in-phase. That is, an increase in a converter input V1, V2 causes an increase in the corresponding converter output V3, V4. Similarly, a decrease in a converter input V1, V2 causes a decrease in the corresponding converter output V3, V4. Because of this, the connections of the transconductance amplifier GM1 are flipped relative to FIG. 2. For example, the load current signal IMON is provided to the noninverting input and the set voltage VSET is provided to the inverting input. In some examples, instead of flipping the inputs of GM1, other changes may be made to close the loop. For example, the signals at the REF1 and REF2 input pins may be provided by A4 and A3 respectively. Alternatively, the inputs to the amplifier A1 may be swapped relative to what is shown in FIGS. 2 and 7.

Changes relative to FIG. 2 are also made to the common mode amplifier A2. A2, as shown, is provided in a unity gain configuration. Resistors RCM1 and RCM2 are connected between the supply voltage VS and ground. This provides a voltage divider such that the common mode control voltage VCMC is proportional to the supply voltage VS based on the ratio of RCM1 and RCM2. In this example configuration, when the supply voltage VIN increases, the common mode control voltage VCMC also increases, which causes the control signals V1, V2 and converter outputs V3, V4 to also increase.

The low-frequency closed-loop gain of the first buck converter 202' from the converter input V1 to V3 is given by Equation [13] below:

$$\frac{V3}{V1} = 1 + \frac{RFB1a}{RFB1b} \quad [13]$$

Similarly, the low-frequency closed-loop gain of the second buck converter 204' is given by Equation [14] below:

$$\frac{V4}{V2} = 1 + \frac{RFB2a}{RFB2b} \quad [13]$$

In some examples, controlling the reference voltages of the buck converters 202', 204' in this manner, the voltages of signals VCP, VCMC, V1, and V2 remain at zero volts or greater, which may allow the differential controller 200 to operate without a negative supply.

Figure 8:
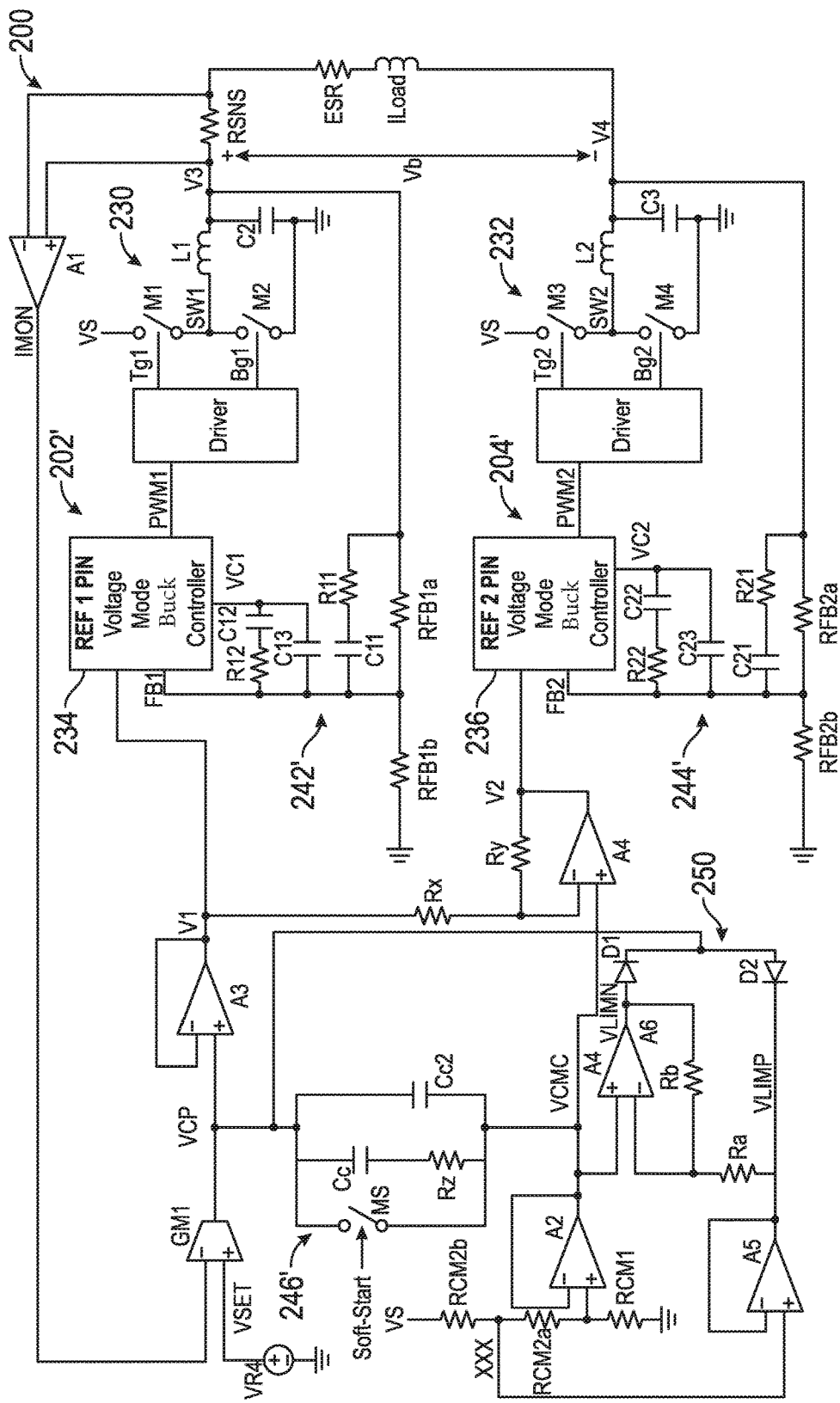
FIG. 8 is a schematic diagram showing another example of the differential controller of FIG. 2 configured with a voltage limit feature and startup control.

FIG. 8 is a schematic diagram showing another example of the differential controller 200 of FIG. 2 configured with a voltage limit feature and startup control. In the example of FIG. 8, the differential controller 200 is implemented with the control signals V1, V2 provided to the converter reference input pins REF1, REF2 as described with respect to FIG. 7, although the voltage limit and startup control features described with respect to FIG. 8 could also be implemented in alternate arrangements, such as the arrangement shown in FIG. 2.

The example of FIG. 8 includes a diode clamping circuit 250 that clamps the voltage VCP and/or the voltage V1, as described. As shown, the resistor RCM2 of the voltage divider associated with common mode amplifier A2 (FIG. 7) is replaced with two resistors RCM2*a* and RCM2*b*. The terminal common to both resistors RCM2*a*, RCM2*b* is connected to an amplifier A5, that is configured as a unity gain buffer. The amplifier A5 generates a positive limiting voltage VLIMP. The output of the amplifier A5. VLIMP, drives the cathode of a diode D2 and resistor Ra. An amplifier A6, resistor Ra, and resistor Rb form an inverting op-amp that generates a negative limiting voltage VLIMN. The output of A6, VLIMN, connects to the anode of a diode D1. The anode of D2 and the cathode of D1 are tied together and are connected to the transconductance amplifier's output VCP. The resistors Ra and Rb may be equal in value such that the gain of the inverting op-amp A6 is unity. The voltage VLIMP may be above the common mode control voltage VCMC, and the voltage difference may be proportional to the supply voltage VS. The voltage VLIMN may be equal to the common mode control voltage VCMC minus the voltage difference between VLIMP and VCMC.

As VS increases, VLIMP also increases and the difference between VLIMP and VLIMN increases. When the transconductance amplifier GM1 sources current and the voltage VCP tries to exceed VLIMP plus a diode, D2 turns on and clamps VCP from increasing further. When the transconductance amplifier GM1 sinks current and the voltage VCP tries to drop below VLIMN minus a diode drop, the diode D1 turns on and clamps VCP from going down further. In this arrangement, the maximum differential output voltage of the system is clamped to be proportional to the supply voltage VS.

In some examples, the diodes D1 and D2 may be connected to the control signal V1 instead of to VCP. For example, the cathode of the diode D1 and the anode of the diode D2 may be connected to the converter input V1 instead of to VCP. In this arrangement, the amplifier A3 may be configured with a weaker drive than the amplifiers A5 and A6 such that amplifiers A5 and A6 take control over V1 when either D1 or D2 turns on. For example, the output current capability of A3 may be limited so that when either D1 or D2 turns on, amplifiers A5 and A6 will dominate A3 and take control over V1.

Also, in the example of FIG. 8, a soft start switch M5 is added to the compensation network 246' to control the way the system starts up and shuts down. The soft start switch M5 may be a field effect transistor (FET), a bi-polar junction transistor (BJT), or any other suitable switching device. During system startup, the converter output voltage V3 and V4 are at 0 V. A soft start control signal commands M5 to a closed position, shorting VCP to VCMC. When VCP is shorted to VCMC, the voltage difference between V1 and V2 is 0 V and the system output (Vb) is zero volts. The converter outputs V3, V4 may rise together during startup to a common mode output voltage determined by the voltage at VCMC. When the converter outputs V3, V4 reach the desired common mode output voltage set by VCMC, the soft start control signal commands the soft start switch M5 to an open position. When the soft start switch M5 is in the open position, the transconductance amplifier GM1 regains control of its output voltage VCP. During shutdown, this sequence may happen in reverse. For example, the soft start command signal commands the soft start switch M5 to the closed position, bringing the differential output voltage Vb to zero. Then both converter outputs V3, V4 ramp down from the common mode output voltage to ground.

FIG. 9 is a schematic diagram showing one example of the differential controller 100 of FIG. 1 with voltage feedback. In the arrangement of FIG. 9, the feedback sensor 111 comprises a voltage sensor 130. The voltage sensor 130 generates a load voltage signal that is proportional to the load voltage Vb. For example, the load voltage signal may be less than or equal to the load voltage V7. The current sense amplifier 112 is replaced with a voltage sense amplifier 132 that generates a load voltage signal VMON that is proportional to the load voltage Vb. The load voltage signal VMON is provided to the transconductance amplifier 114, which operates to generate VCP as described above with respect to FIG. 1. In this way, the set voltage VSET is used to select values for the regulator control signals CIN1, CIN2 that drive the output voltage Vb to a value indicated by VSET.

Figure 10:
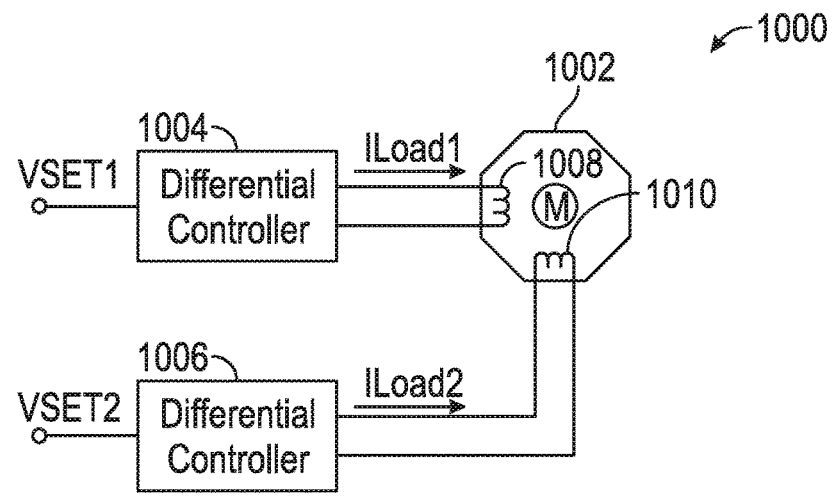
FIG. 10 is a schematic diagram showing an example arrangement using differential controllers described herein to drive a stepper motor.

FIG. 10 is a schematic diagram showing an example arrangement 1000 using differential controllers described herein to drive a stepper motor 1002. Two differential controllers 1004, 1006 are shown. Differential controllers 1004, 1006 may be examples of any of the differential controllers 100, 200 described herein or variations thereof. Differential controller 1004 receives a set voltage VSET1 and generates a load current ILOAD1 that is provided to a first winding 1008 of the stepper motor 1002. Differential controller 1006 receives a set voltage VSET2 and generates a load current ILOAD2 that is provided to a second winding 1010 of the stepper motor 1002.

The stepper motor 1002 moves in discrete steps, which each step may cause the stepper motor 1002 to rotate by a fraction of a whole revolution. Because the stepper motor 1002 moves in discrete steps, its motion may not be smooth, especially when the stepper motor 1002 moves at low speed and/or has a large step size. In some examples, the arrangement 1000 implements a micro stepping technique. A micro stepping technique is used to achieve rotation of the stepper motor 1002 that is a fraction of a step by controlling the current to the motor windings 1008, 1010. Use of the differential controllers 1004, 1006 described herein may increase the accuracy of the load currents ILOAD1, ILOAD2, facilitating micro stepping in the operation of the stepper motor 1002.

Figure 11:
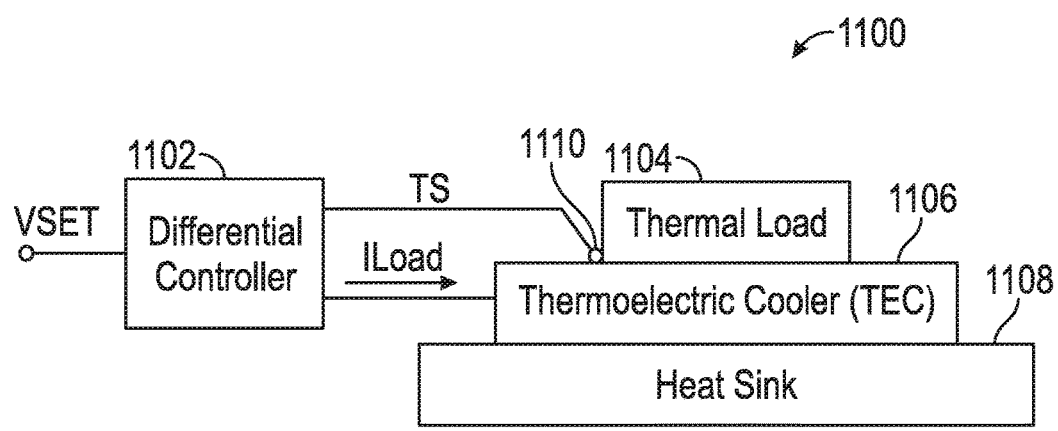
FIG. 11 is a diagram showing an example arrangement using a differential controller to drive a thermoelectric cooling or heating device (TEC).

FIG. 11 is a diagram showing an example arrangement 1100 using a differential controller 1102 to drive a thermoelectric cooling or heating device (TEC) 1106. The differential controller 1102 may be or include any of the differential controllers 100, 200 described herein or variations thereof. Increased accuracy of the differential controller 1102 may allow more accurate thermal control of the TEC.

The differential controller receives a temperature feedback signal TS from a temperature sensor 1110. The temperature feedback signal TS may be or be used to derive a set voltage VSET for the differential controller 1102. The differential controller 1102 generates a load current ILOAD that is provided to the TEC 1106.

The TEC 1106 generates heating and/or cooling based on the load current ILOAD. The TEC 1106, in some examples, is in thermal communication with a heat sink 1108 and a thermal load 1104. The thermal load 1104 may be any device or component to be heated or cooled. In some examples, the thermal load 1104 includes an optical device, such as an optical transceiver, an optic amplifier, etc. The TEC 1106, in some examples, operates according to the Peltier effect to move heat from one side of a device to the other. For example, if the thermal load 1104 is to be cooled, the TEC 1106 moves heat from the thermal load 1104 to the heat sink 1108. If the thermal load 1104 is to be heated, the TEC 1106 moves heat from the heat sink 1108 to the thermal load 1104. The amount of heat moved by the TEC 1106 and the direction in which the heat is moved is based on the load current ILOAD provided by the differential controller.

ADDITIONAL EXAMPLES

Example 1 is a differential controller, comprising; a first regulator configured to receive a first regulator control signal at a first regulator input and generate a first regulator output signal at a first regulator output; a second regulator configured to receive a second regulator control signal at a second regulator input and generate a second regulator output signal at a second regulator output; a feedback sensor configured to generate a feedback signal describing a load between the first regulator output and the second regulator output; a first amplifier configured to generate the first regulator control signal using the feedback signal and a set voltage; and a second amplifier configured to generate the second regulator control signal using the first regulator control signal and a common mode control voltage, wherein the first regulator output and the second regulator output are based at least in part on the common mode control voltage.

In Example 2, the subject matter of Example 1 optionally includes wherein the feedback sensor comprises a current sensor and wherein the feedback signal describes a load current at the load.

In Example 3, the subject matter of any one or more of Examples 1-2 optionally includes a compensation network coupled between a first amplifier output of the first amplifier and the common mode control voltage.

In Example 4, the subject matter of Example 3 optionally includes wherein the load comprises an inductive component, and wherein the load comprises a pole at a load pole frequency, and wherein the compensation network comprises a zero at the load pole frequency.

In Example 5, the subject matter of any one or more of Examples 3-4 optionally includes a soft start switch having a closed position and an open position, wherein when the soft start switch is in the closed position, the soft start switch shorts the compensation network.

In Example 6, the subject matter of any one or more of Examples 1-5 optionally includes a common mode amplifier configured to generate the common mode control voltage using a supply voltage.

In Example 7, the subject matter of any one or more of Examples 1-6 optionally includes wherein the second regulator control signal is proportional to a difference between the first regulator control signal and the common mode control voltage.

In Example 8, the subject matter of any one or more of Examples 1-7 optionally includes wherein the first regulator comprises a buck converter.

In Example 9, the subject matter of Example 8 optionally includes a common mode amplifier configured to generate the common mode control voltage using a supply voltage and a common mode reference voltage, wherein the common mode reference voltage is proportional to a reference voltage of the buck converter.

In Example 10, the subject matter of any one or more of Examples 1-9 optionally includes wherein the first regulator comprises a first regulator feedback network, and wherein the control signal is provided to the first regulator feedback network.

In Example 11, the subject matter of any one or more of Examples 1-10 optionally includes wherein the first regulator comprises a linear regulator.

In Example 12, the subject matter of any one or more of Examples 1-11 optionally includes a clamping circuit configured to clamp a differential voltage between the first regulator control signal and the second regulator control signal to a maximum value.

In Example 13, the subject matter of any one or more of Examples 1-12 optionally includes wherein the feedback sensor comprises a current sensor and wherein the feedback signal indicates a load current at the load.

In Example 14, the subject matter of any one or more of Examples 1-13 optionally includes wherein the feedback sensor comprises a voltage sensor and wherein the feedback signal indicates a load voltage.

Example 15 is a method of controlling a load with a differential controller comprising a first regulator and a second regulator, the method comprising: sensing, by a feedback sensor, a load condition to generate a feedback signal; generating, by a first amplifier, a first regulator control signal for the first regulator using the feedback signal and a set voltage; and generating, by a second amplifier, a second regulator control signal for the second regulator using the first regulator control signal and a common mode control voltage, wherein a first regulator output and a second regulator output are based at least in part on the common mode control voltage.

In Example 16, the subject matter of Example 15 optionally includes wherein the feedback sensor comprises a current sensor and wherein the feedback signal indicates a load current at the load.

In Example 17, the subject matter of any one or more of Examples 15-16 optionally includes generating the common mode control voltage using a supply voltage and a common mode reference voltage.

In Example 18, the subject matter of Example 17 optionally includes responsive to an increase in the supply voltage, increasing the common mode control voltage; responsive to the increasing of the common mode control voltage, modifying the first regulator control signal to increase a voltage of a first regulator output signal; and responsive to the increasing of the common mode control voltage, modifying the second regulator control signal to increase a voltage of a second regulator output signal.

In Example 19, the subject matter of any one or more of Examples 15-18 optionally includes responsive to a decrease in a supply voltage, decreasing the common mode control voltage; responsive to the decrease in the common mode control voltage, modifying the first regulator control signal to decrease a voltage of a first regulator output signal; and response to the decrease in the common mode control voltage, modifying the second regulator control signal to decrease a voltage of a second regulator output signal.

Example 20 is a differential controller, comprising; means generating a first regulator output signal at a first regulator output based at least in part on a first regulator control signal received at a first regulator input; means generating a second regulator output signal at a second regulator output based at least in part on a second regulator control signal received at a second regulator input; means for generating a feedback signal describing a condition at a load between the first regulator output and the second regulator output; means for generating the first regulator control signal using the feedback signal and a set voltage; and means for generating the second regulator control signal using the first regulator control signal and a common mode control voltage, wherein the first regulator output and the second regulator output are based at least in part on the common mode control voltage.

The above detailed description includes references to the accompanying drawings, which form a part of the detailed description. The drawings show, by way of illustration, specific embodiments in which the inventive subject matter can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The term "circuit" can include a dedicated hardware circuit, a general-purpose microprocessor, digital signal processor, or other processor circuit, and may be structurally configured from a general purpose circuit to a specialized circuit such as using firmware or software.

Any one or more of the techniques (e.g., methodologies) discussed herein may be performed on a machine. In various embodiments, the machine may operate as a standalone device or may be connected (e.g., networked) to other machines. In a networked deployment, the machine may operate in the capacity of a server machine, a client machine, or both in server-client network environments. In an example, the machine may act as a peer machine in peer-to-peer (P2P) (or other distributed) network environment. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions can enable embedded hardware (e.g., the execution units or a loading mechanism) to create members of the circuit set in hardware via the variable connections to carry out portions of the specific operation when in operation. Accordingly, the computer-readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Particular implementations of the systems and methods described herein may involve use of a machine (e.g., computer system) that may include a hardware processor (e.g., a central processing unit (CPU), a graphics processing unit (GPU), a hardware processor core, or any combination thereof), a main memory and a static memory, some or all of which may communicate with each other via an interlink (e.g., bus). The machine may further include a display unit, an alphanumeric input device (e.g., a keyboard), and a user interface (UI) navigation device (e.g., a mouse). In an example, the display unit, input device and UI navigation device may be a touch screen display. The machine may additionally include a storage device (e.g., drive unit), a signal generation device (e.g., a speaker), a network interface device, and one or more sensors, such as a global positioning system (GPS) sensor, compass, accelerometer, or other sensor. The machine may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine-readable medium on which is stored one or more sets of data structures or instructions (e.g., software) embodying or utilized by any one or more of the techniques or functions described herein. The instructions may also reside, completely or at least partially, within the main memory, within static memory, or within the hardware processor during execution thereof by the machine. In an example, one or any combination of the hardware processor, the main memory, the static memory, or the storage device may constitute machine-readable media.

While the machine-readable medium can include a single medium, the term "machine-readable medium" may include a single medium or multiple media (e.g., a centralized or distributed database, and/or associated caches and servers) configured to store the one or more instructions.

The term "machine-readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices, magnetic disks, such as internal hard disks and removable disks; magneto-optical disks; and CD-ROM and DVD-ROM disks.

The instructions may further be transmitted or received over a communications network using a transmission medium via the network interface device utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device may include one or more physical jacks (e.g., Ethernet, coaxial, or phone jacks) or one or more antennas to connect to the communications network. In an example, the network interface device may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine, and includes digital or analog communications signals or other intangible medium to facilitate communication of such software.

Method examples described herein can be machine- or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the inventive subject matter should be determined with reference to the appended claims, along with the full scope of equivalents to which such claims are entitled.

The claimed invention is:
1. A differential controller, comprising;
   a first regulator configured to receive a first regulator control signal at a first regulator input and generate a first regulator output signal at a first regulator output;
   a second regulator configured to receive a second regulator control signal at a second regulator input and generate a second regulator output signal at a second regulator output;

a feedback sensor configured to generate a feedback signal based on a condition of a load between the first regulator output and the second regulator output;
a first amplifier configured to generate the first regulator control signal using the feedback signal and a set voltage; and
a second amplifier configured to generate the second regulator control signal using the first regulator control signal and a common mode control voltage, wherein the first regulator output and the second regulator output are based at least in part on the common mode control voltage.

2. The differential controller of claim 1, wherein the feedback sensor comprises a current sensor and wherein the feedback signal is based on a load current at the load.

3. The differential controller of claim 1, further comprising a compensation network coupled between a first amplifier output of the first amplifier and the common mode control voltage.

4. The differential controller of claim 3 wherein the load comprises an inductive component, and wherein the load comprises a pole at a load pole frequency, and wherein the compensation network comprises a zero at the load pole frequency.

5. The differential controller of claim 3, further comprising a soft start switch having a closed position and an open position, wherein when the soft start switch is in the closed position, the soft start switch shorts the compensation network.

6. The differential controller of claim 1, further comprising a common mode amplifier configured to generate the common mode control voltage using a supply voltage.

7. The differential controller of claim 1, wherein the second regulator control signal is proportional to a difference between the first regulator control signal and the common mode control voltage.

8. The differential controller of claim 1, wherein the first regulator comprises a buck converter.

9. The differential controller of claim 8, further comprising a common mode amplifier configured to generate the common mode control voltage using a supply voltage and a common mode reference voltage, wherein the common mode reference voltage is proportional to a reference voltage of the buck converter.

10. The differential controller of claim 1, wherein the first regulator comprises a first regulator feedback network, and wherein the first regulator control signal is provided to the first regulator feedback network.

11. The differential controller of claim 1, wherein the first regulator comprises a linear regulator.

12. The differential controller of claim 1, further comprising a clamping circuit configured to clamp a differential voltage between the first regulator control signal and the second regulator control signal to a maximum value.

13. The differential controller of claim 1, wherein the feedback sensor comprises a voltage sensor and wherein the feedback signal indicates a load voltage.

14. The differential controller of claim 1, wherein the first regulator comprises a switching regulator.

15. A method of controlling a load with a differential controller comprising a first regulator and a second regulator, the method comprising:
sensing, by a feedback sensor, a load condition to generate a feedback signal, the load condition associated with the load, wherein the load is between a first regulator output of the first regulator and a second regulator output of the second regulator;
generating, by a first amplifier, a first regulator control signal for the first regulator using the feedback signal and a set voltage; and
generating, by a second amplifier, a second regulator control signal for the second regulator using the first regulator control signal and a common mode control voltage, wherein the first regulator output and the second regulator output are based at least in part on the common mode control voltage.

16. The method of claim 15, wherein the feedback sensor comprises a current sensor and wherein the feedback signal indicates a load current at the load.

17. The method of claim 15, further comprising generating the common mode control voltage using a supply voltage and a common mode reference voltage.

18. The method of claim 17, further comprising:
responsive to an increase in the supply voltage, increasing the common mode control voltage;
responsive to the increasing of the common mode control voltage, modifying the first regulator control signal to increase a voltage of a first regulator output signal; and
responsive to the increasing of the common mode control voltage, modifying the second regulator control signal to increase a voltage of a second regulator output signal.

19. The method of claim 15, further comprising:
responsive to a decrease in a supply voltage, decreasing the common mode control voltage;
responsive to the decrease in the common mode control voltage, modifying the first regulator control signal to decrease a voltage of a first regulator output signal; and
response to the decrease in the common mode control voltage, modifying the second regulator control signal to decrease a voltage of a second regulator output signal.

20. The method of claim 15, wherein the first regulator comprises a switching regulator.

21. A differential controller, comprising;
means for generating a first regulator output signal at a first regulator output based at least in part on a first regulator control signal received at a first regulator input;
means for generating a second regulator output signal at a second regulator output based at least in part on a second regulator control signal received at a second regulator input;
means for generating a feedback signal based on a condition at a load between the first regulator output and the second regulator output;
means for generating the first regulator control signal using the feedback signal and a set voltage; and
means for generating the second regulator control signal using the first regulator control signal and a common mode control voltage, wherein the first regulator output and the second regulator output are based at least in part on the common mode control voltage.

22. The differential controller of claim 21, wherein the first regulator comprises a switching regulator.

23. A differential controller, comprising;
a first regulator configured to generate a first regulator output signal at a first regulator output based at least in part on a first regulator control signal and a supply voltage;
a first control circuit configured to generate the first regulator control signal using a feedback signal indicating a condition of a load between the first regulator output and a second regulator output;

a second regulator configured to generate a second regulator output signal at the second regulator output, wherein the second regulator output signal is based at least in part on a second regulator control signal and the supply voltage;

a second control circuit configured to generate the second regulator control signal using the first regulator control signal and a common mode control signal; and a common mode voltage circuit configured to generate the common mode control signal based at least in part on the supply voltage, wherein the common mode voltage circuit responds to a change in the supply voltage by changing the common mode control signal.

24. The differential controller of claim 23, wherein the change in the supply voltage does not change an output of the differential controller at the load.

25. The differential controller of claim 23, further comprising a compensation network coupled between the first control circuit and the second control circuit.

* * * * *